(12) United States Patent
Ishizawa et al.

(10) Patent No.: US 11,642,818 B2
(45) Date of Patent: May 9, 2023

(54) FLUIDIC DEVICE, METHOD OF MANUFACTURING FLUIDIC DEVICE, AND VALVE FOR FLUIDIC DEVICE

(71) Applicant: NIKON CORPORATION, Tokyo (JP)

(72) Inventors: Naoya Ishizawa, Saitama (JP); Taro Ueno, Tokyo (JP); Masaaki Tanabe, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 269 days.

(21) Appl. No.: 16/241,684

(22) Filed: Jan. 7, 2019

(65) Prior Publication Data

US 2019/0134860 A1 May 9, 2019

Related U.S. Application Data

(63) Continuation of application No. PCT/JP2017/024982, filed on Jul. 7, 2017.

(30) Foreign Application Priority Data

Jul. 13, 2016 (JP) .............................. JP2016-138337

(51) Int. Cl.
*B29C 39/04* (2006.01)
*B29C 39/26* (2006.01)
(Continued)

(52) U.S. Cl.
CPC ............... *B29C 39/04* (2013.01); *B01J 19/00* (2013.01); *B01L 3/502738* (2013.01);
(Continued)

(58) Field of Classification Search
CPC ..... B01L 2400/0481; B01L 2400/0487; B01L 2400/049; B01L 2200/0689;
(Continued)

(56) References Cited

U.S. PATENT DOCUMENTS

| 6,066,216 A | 5/2000 | Ruppel |
| 2005/0245889 A1 | 11/2005 | Haecker et al. |
| 2009/0152326 A1* | 6/2009 | Shin .................... B81C 1/00119 228/110.1 |

(Continued)

FOREIGN PATENT DOCUMENTS

| EP | 1905514 A1 | 4/2008 |
| JP | 2002/536210 A | 10/2002 |

(Continued)

OTHER PUBLICATIONS

Notice of Reaons for Rejection dated Nov. 17, 2020 for Japanese Patent Application No. 2018-527580, with English translation (6 pages).
International Search Report for PCT/JP2017/024982 dated Sep. 19, 2017, with English translation, 4 pages.
(Continued)

*Primary Examiner* — Michael M. Robinson
*Assistant Examiner* — Victoria Bartlett
(74) *Attorney, Agent, or Firm* — Squire Patton Boggs (US) LLP

(57) ABSTRACT

A method of manufacturing a fluidic device includes molding either one of the base member and the valve part with a first mold; and molding the other one of the base member and the valve part with a second mold with respect to the molded base member or the molded valve part.

10 Claims, 17 Drawing Sheets

(51) Int. Cl.
*B01J 19/00* (2006.01)
*G01N 37/00* (2006.01)
*B01L 3/00* (2006.01)
*B81C 99/00* (2010.01)

(52) U.S. Cl.
CPC .......... *B29C 39/26* (2013.01); *B81C 99/0085* (2013.01); *G01N 37/00* (2013.01); *B01L 3/502707* (2013.01); *B01L 2200/0689* (2013.01); *B01L 2300/0887* (2013.01); *B01L 2400/049* (2013.01); *B01L 2400/0481* (2013.01); *B01L 2400/0487* (2013.01); *B01L 2400/0672* (2013.01); *B81B 2201/054* (2013.01); *B81C 2201/034* (2013.01)

(58) Field of Classification Search
CPC ....... B01L 2300/0887; B01L 3/502707; B01L 3/502738; B29C 39/04; B29C 39/26; B29C 39/1615; B29C 39/1675; B81B 2201/054; B81C 2201/034; B81C 99/0085; G01N 37/00; B01J 19/00
See application file for complete search history.

(56) References Cited

U.S. PATENT DOCUMENTS

| 2013/0037139 A1 | 2/2013 | Manaresi et al. |
| 2015/0258544 A1* | 9/2015 | Stern .................. F16K 99/0059 506/6 |
| 2015/0352549 A1* | 12/2015 | Kolb .................. F16K 99/0015 422/505 |

FOREIGN PATENT DOCUMENTS

| JP | 2006-503204 A | 1/2006 |
| WO | WO 00/46028 A1 | 8/2000 |

OTHER PUBLICATIONS

Written Opinion of the International Searching Authority for PCT/JP2017/024982 dated Sep. 19, 2017, with English translation, 15 pages.

Hong, Jong Wook, et al. "A nanoliter-scale nucleic acid processor with parallel architecture," Nature Biotechnology, vol. 22, No. 4, Apr. 2004, pp. 435-439.

\* cited by examiner

FLUIDIC DEVICE, METHOD OF MANUFACTURING FLUIDIC DEVICE, AND VALVE FOR FLUIDIC DEVICE

CROSS-REFERENCE TO RELATED APPLICATION

Priority is claimed on Japanese Patent Application No. 2016-138337, filed Jul. 13, 2016. The present application is a continuation application of International Application PCT/JP2017/024982, filed on Jul. 7, 2017. The contents of the above applications are incorporated herein.

BACKGROUND

Technical Field

The present invention relates to a fluidic device, a method of manufacturing a fluidic device, and a valve for a fluidic device.

In recent years, the development of micro-total analysis systems (µ-TAS) with an aim of high-speed, high efficiency, and integrated testing in the field of extracorporeal diagnosis or micro-miniaturization of analysis equipment has attracted attention, and active research thereon is underway worldwide.

µ-TAS is superior in comparison with analysis equipment in the related art in that measurement and analysis can be performed with a small amount of specimen, and that systems are portable, and disposable due to having a low cost, and so on. Further, µ-TAS is drawing attention as a method with high usefulness when expensive reagents are used or when small amounts of multiple-specimen are analyzed.

A device including a flow path and a pump disposed on the flow path has been reported as a component of µ-TAS (Jong Wook Hong, Vincent Studer, Giao Hang, W French Anderson and Stephen R Quake, Nature Biotechnology 22, 435-439 (2004)). In such a device, a plurality of solutions are mixed in the flow path by injecting the plurality of solutions into the flow path and operating the pump.

SUMMARY

According to a first aspect of the present invention, there is provided a method of manufacturing a fluidic device including a base member and a valve part, the method including: molding either one of the base member and the valve part with a first mold; and molding the other one of the base member and the valve part with a second mold with respect to the molded base member or the molded valve part.

According to a second aspect of the present invention, there is provided a method of manufacturing a fluidic device including a first base member and a valve part, the method including: molding either one of the first base member and the valve part with a first mold; and molding the other one of the first base member and the valve part on a part of the either one of the first base member and the valve part with a second mold and the molded either one of the first base member and the valve part.

According to a third aspect of the present invention, there is provided a method of manufacturing a fluidic device including a flow path, the method including: molding a first molding section with a first mold; molding a second molding section with a second mold; and integrally molding the first molding section and the second molding section by fusing the second molding section to at least a part of the first molding section upon the molding with the second mold.

According to a fourth aspect of the present invention, there is provided a fluidic device including: a valve part that opens and closes a flow path according to a fluid; a seal section that is integrally formed with the valve part and that seals the fluid by coming in contact with a member that supplies the fluid; and a base member on which the valve part and the seal section are disposed.

According to a fifth aspect of the present invention, there is provided a fluidic device including: a flow path-side base member having a flow path; a bonding base member having an opening section that penetrates therethrough at a position facing a flow path and in which one surface facing the flow path is bonded to the flow path-side base member; a valve part driven to open and close the flow path; and a valve driven section with which a seal section that airtightly seals the opening section is integrally formed.

According to a sixth aspect of the present invention, there is provided a fluidic device including: a flow path-side base member having a flow path on the side of one surface and an opening section that opens on the side of a bottom section of the flow path and on the other surface; a bonding base member in which one surface facing the flow path is bonded to the flow path-side base member; a valve part driven to open and close the flow path; and a valve driven section with which a seal section that airtightly seals the opening section is integrally formed.

According to a seventh aspect of the present invention, there is provided a valve for a fluidic device including: a valve part that opens and closes a flow path according to a fluid; and a seal section that is integrally formed with the valve part and that seals the fluid by coming in contact with a member that supplies the fluid.

DESCRIPTION OF THE EMBODIMENTS

Figure 1:
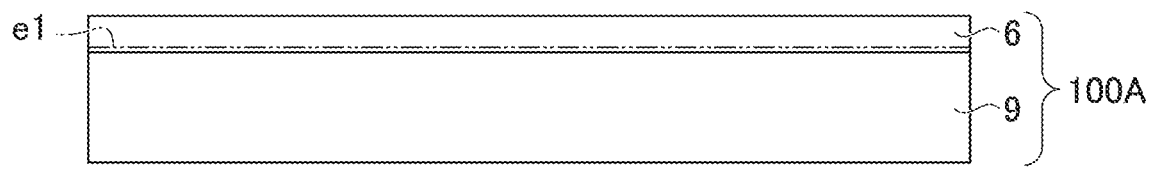
FIG. 1 is a schematic front view of a fluidic device according to an embodiment.

Hereinafter, embodiments of a fluidic device and a method of manufacturing the fluidic device will be described with reference to FIGS. 1 to 37. Further, characteristic portions in the drawings used in the following description may be enlarged for the sake of ease of understanding of features thereof, and dimensional proportions thereof may not necessarily be the same as actual dimensional proportions.

First Embodiment of Fluidic Device

Figure 2:
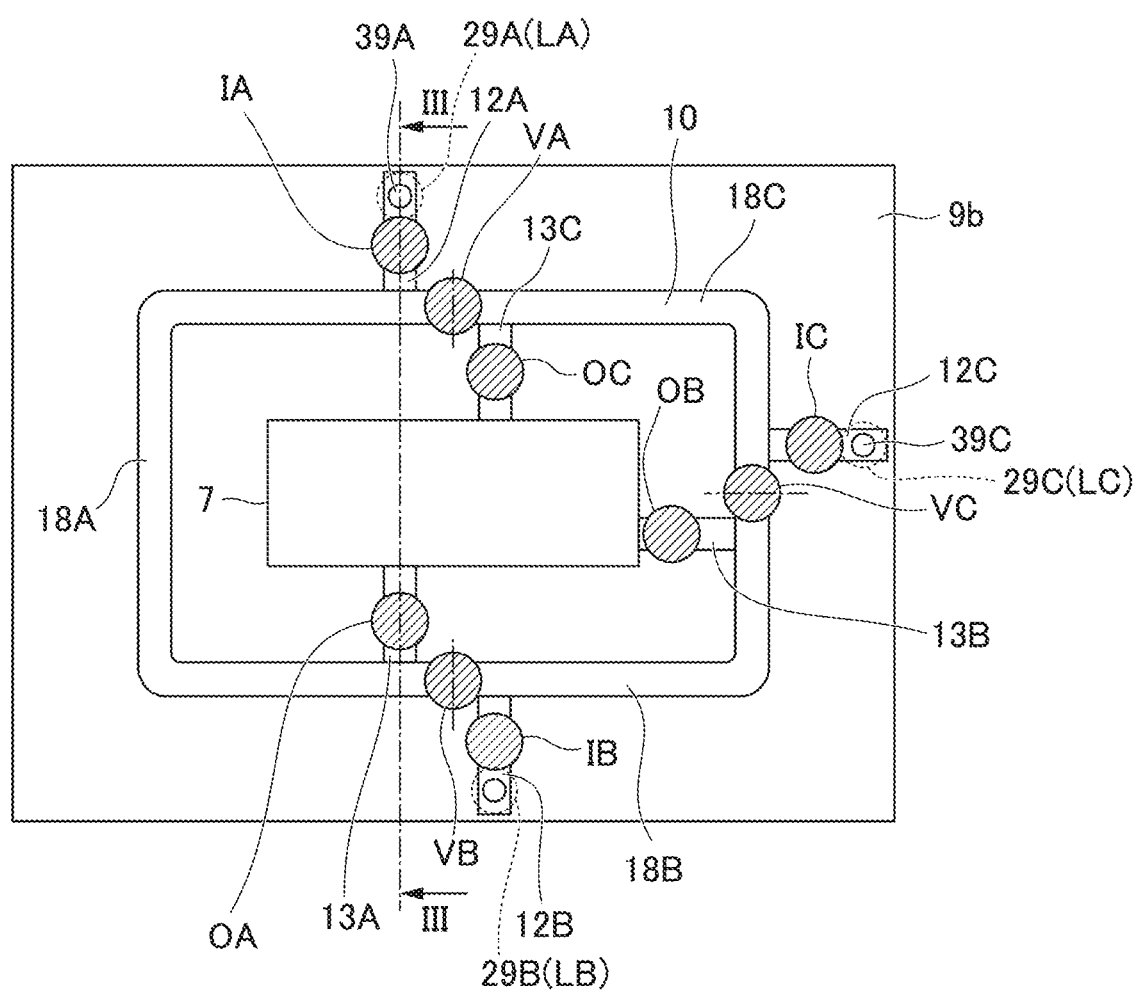
FIG. 2 is a plan view schematically showing the fluidic device according to the embodiment.

FIG. 1 is a front view of a fluidic device 100A of a first embodiment. FIG. 2 is a plan view schematically showing the fluidic device 100A. Further, in FIGS. 1 and 2, illustration of a gas flow path configured to discharge or introduce a gas (for example, air) in a flow path when a liquid is introduced is omitted. Further, the fluidic device 100A includes a flow path having a width or a depth of about several μm to several hundreds of mm.

The fluidic device 100A of the embodiment includes a device configured to detect a specimen substance that is a detection target included in an analytical specimen using hybridization, an immunological response, an enzyme reaction, and so on. The specimen material may be a biomolecule such as a nucleic acid, DNA, RNA, a peptide, a protein, extracellular endoplasmic reticulum, or the like. The fluidic device 100A includes an upper plate (a base member, a bonding base member, a second bonding base member) 6 and a substrate (a base member, a flow path-side base member, a first bonding base member) 9. The upper plate 6 and the substrate 9 are formed of a resin material (a hard material such as polypropylene, polycarbonate, or the like) as an example.

For example, as described below, the upper plate 6 and the substrate 9 are bonded via an energy director section (hereinafter, referred to as an ED section e1) through ultrasonic welding. Each of the upper plate 6 and the substrate 9 has a plurality of (for example two) positioning holes (not shown) that penetrate the plate in a bonding direction and perform positioning in a surface direction. The upper plate 6 and the substrate 9 can be stacked (multilayered) in a state in which the plates are positioned in the surface direction by inserting shaft members into the positioning holes.

Further, in the following description, the upper plate (for example, a lid section, an upper section or a lower section of a flow path, an upper surface or a bottom surface of a flow path) 6 and the substrate 9 will be described as being disposed along a horizontal surface, and the upper plate 6 will be described as being disposed above the substrate 9. However, this is merely a definition of the horizontal direction and the upward/downward direction for the convenience of description and does not limit a direction in use of the fluidic device 100A according to the embodiment.

Figure 3:
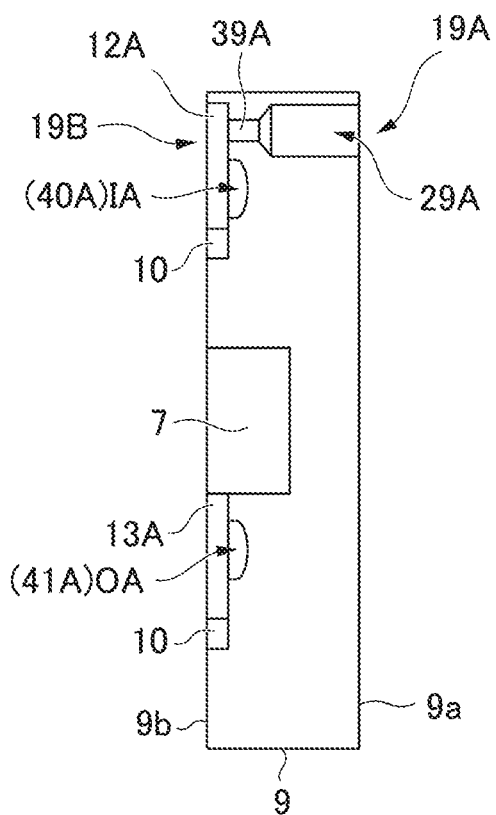
FIG. 3 is a cross-sectional view taken along line in FIG. 2.

FIG. 2 is a plan view (a top view) showing the substrate 9 seen from the upper plate 6 side. FIG. 3 is a cross-sectional view taken along line in FIG. 2.

As shown in FIG. 3, the substrate 9 includes a reservoir layer 19A on the side of a lower surface (one surface) 9a, and a reaction layer 19B on the side of an upper surface (the other surface) 9b. The reservoir layer 19A has a plurality of (in FIG. 2, three) inlets 29A, 29B and 29C disposed on the lower surface 9a of the substrate 9. The inlets 29A, 29B and 29C can accommodate solutions (for example, an analytical specimen, a reagent used in a reaction or cleaning) independently from each other. The inlets 29A, 29B and 29C extend in a thickness direction of the substrate 9 (for example, a direction perpendicular to or crossing the lower surface 9a or the upper surface 9b), and are constituted by voids that open to the lower surface 9a. A cross section of the void has a circular shape as an example. Volumes of the inlets 29A, 29B and 29C are set according to quantities of the accommodated solutions. For example, the inlets 29A, 29B and 29C may have cross-sectional areas and depths that are set according to quantities of the accommodated solutions. Further, in FIG. 3, while only the inlet 29A is shown, the inlets 29B and 29C have the same shape as that of the inlet 29A.

One end side (a bottom section side) of the inlet 29A is connected to a penetration section 39A that penetrates the substrate 9 in a thickness direction (for example, a direction perpendicular to or crossing the lower surface 9a or the upper surface 9b). One end side (a bottom section side) of the inlet 29B is connected to a penetration section 39B that penetrates the substrate 9 in a thickness direction (for example, a direction perpendicular to or crossing the lower surface 9a or the upper surface 9b). One end side (a bottom section side) of the inlet 29C is connected to a penetration section 39C that penetrates the substrate 9 in a thickness direction (for example, a direction perpendicular to or crossing the lower surface 9a or the upper surface 9b).

As shown in FIG. 2, the reaction layer 19B has a circulation flow path 10, introduction flow paths 12A, 12B and 12C, discharge flow paths 13A, 13B and 13C, a waste liquid tank 7, fixed quantity valves VA, VB and VC, introduction valves IA, IB and IC, and waste liquid valves OA, OB and OC, which are disposed on the upper surface 9b of the substrate 9. In the following description, the fixed quantity valves VA, VB and VC, the introduction valves IA, IB and IC, and the waste liquid valves OA, OB and OC will be appropriately generally referred to as valves V.

The fixed quantity valves VA, VB and VC are disposed such that divisions of the circulation flow path 10 divided by the fixed quantity valves have predetermined volumes, respectively. For example, the fixed quantity valves VA, VB and VC divide the circulation flow path 10 into a first fixed quantity division 18A, a second fixed quantity division 18B and a third fixed quantity division 18. Further, configurations of the fixed quantity valves VA, VB and VC will be described below.

The introduction flow path 12A is connected to the inlet 29A via the penetration section (the penetration flow path) 39A on one end side, and connected to the circulation flow path 10 from the outside on the other end side. For example, a position at which the introduction flow path 12A is connected to the circulation flow path 10 is in the vicinity of the fixed quantity valve VA in the first fixed quantity division 18A. For example, the introduction flow path 12A and the inlet 29A partially overlap each other when seen from above (for example, when seen from above the upper plate 6 and the substrate 9 in the stacking direction), and are connected to each other via the penetration section 39A disposed at an overlapping portion.

The introduction flow path 12B is connected to the inlet 29B via the penetration section 39B on one end side, and connected to the circulation flow path 10 from the outside on the other end side. For example, a position at which the introduction flow path 12B is connected to the circulation flow path 10 is in the vicinity of the fixed quantity valve VB in the second fixed quantity division 18B. For example, the introduction flow path 12B and the inlet 29B partially overlap each other and are connected to each other via the penetration section 39B disposed at an overlapping portion when seen from above (for example, when seen from above the upper plate 6 and the substrate 9 in the stacking direction).

The introduction flow path 12C is connected to the inlet 29C via the penetration section 39C on one end side, and connected to the circulation flow path 10 from the outside on the other end side. For example, a position at which the introduction flow path 12C is connected to the circulation flow path 10 is in the vicinity of the fixed quantity valve VC in the third fixed quantity division 18C. For example, the introduction flow path 12C and the inlet 29C partially overlap each other and are connected to each other via the penetration section 39C disposed on an overlapping portion when seen from above (for example, when seen from above the upper plate 6 and the substrate 9 in the stacking direction).

For example, in the substrate 9, since the introduction flow paths 12A, 12B and 12C and the inlets 29A, 29B and 29C are connected to each other via the penetration sections 39A, 39B and 39C installed at portions where they overlap each other, respectively, distances between the introduction flow paths and the inlets (for example a distance over which the solution flows) are shortened, pressure loss when the solutions are introduced into the introduction flow paths from the inlets is reduced, and the solutions can be easily and rapidly introduced.

First Embodiment of Valve

Figure 4:
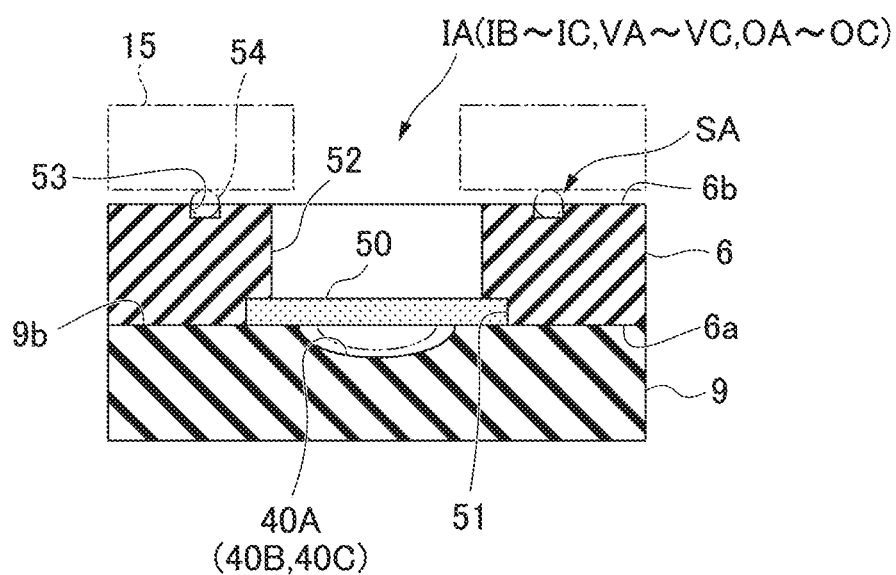
FIG. 4 is a cross-sectional view showing a configuration of an introduction valve according to the embodiment.

The introduction valve IA is disposed between the penetration section 39A and the circulation flow path 10 in the introduction flow path 12A. FIG. 4 is a cross-sectional view showing a configuration of the introduction valve IA as a first embodiment of the valve. Further, since the configuration of the introduction valve IA is the same as the configuration of each of the introduction valves IB and IC, the fixed quantity valves VA, VB and VC and the waste liquid valves OA, OB and OC except that the flow paths of opening/closing targets are different, reference characters of the introduction valves IB and IC, the fixed quantity valves VA, VB and VC and the waste liquid valves OA, OB and OC are designated as in FIG. 4, and description thereof will be omitted.

As shown in FIG. 4, the introduction valve IA includes a cavity 40A (see FIG. 3) having a curved surface shape (for example, a hemispherical shape) and arranged in the substrate 9 to divide the introduction flow path 12A, and a disk-shaped valve part 50 that is disposed in the upper plate 6 to face with the cavity 40A, that is configured to close the introduction flow path 12A when abutting the cavity 40A while elastically deformed, and that is configured to open the introduction flow path 12A when separated from the cavity 40A. The valve part 50 is elastically deformed and abuts the cavity 40A by a force (for example, an air pressure, a liquid pressure) in a direction that is directed downward which is applied by a control of a fluid (for example, a gas, a liquid) as an example. In the embodiment, an air pressure in a direction that is directed downward is supplied (a force is applied) by a valve driving section (an application section) 15 disposed on an upper surface 6b side of the upper plate 6.

An outer diameter of the valve part 50 is larger than an outer diameter of the cavity 40A. For example, the valve part 50 is formed of a soft material and thus has flexibility. The valve part 50 controls an opening/closing state of the introduction flow path 12A through deformation. As an example, the valve part 50 closes the introduction flow path 12A by being displaced downward as shown by a curved alternating two-dot dashed line in FIG. 4 and coming in contact with the cavity 40A when a force in a downward direction is applied, and opens the introduction flow path 12A when the force in the downward direction is released and thereby the displacement is solved by an elastic recovering force. For example, a thermoplastic elastomer such as a polyolefin-based elastomer, styrene-based elastomer, polyester-based elastomer, or the like, may be exemplified as a soft material. In this way, the valve part 50 is constituted as a valve driven section that is deformed by the valve driving section 15.

A cavity 51 having a circular shape at a position facing the cavity 40A when seen in a plan view is formed in a lower surface (one surface) 6*a* of the upper plate 6. The cavity 51 has a structure in which the valve part 50 is contained. An inner diameter of the cavity 51 has a size such that an outer circumferential surface of the valve part 50 fits thereinto. A depth of the cavity 51 is equal to a thickness of the valve part 50. When the introduction flow path 12A is in an open state, a lower surface of the valve part 50 accommodated in the cavity 51 (a surface in contact with the cavity 40A when the flow path is closed) is substantially flush with the lower surface 6*a* of the upper plate 6. In addition, the upper plate 6 has an opening section 52 that opens to a bottom section of the cavity 51. The opening section 52 penetrates the upper plate 6 in a thickness direction (for example, a direction perpendicular to or crossing the lower surface 6*a* or an upper surface 6*b*). For example, an inner diameter of the opening section 52 is larger than an outer diameter of the cavity 40A.

A sealing area SA configured to air-tightly seal the opening section 52 with respect to air external of the fluidic device 100A is formed on the upper surface (the other surface) 6*b* of the upper plate 6. For example, the sealing area SA includes a groove section 53 formed in the upper surface 6*b* in an annular shape around the opening section 52. A seal member 54 is accommodated in the groove section 53. The seal member 54 is, for example, an O-ring. Further, the sealing area SA may have a configuration in which the sealing area SA is disposed around only a part of the opening section 52. In this case, at a place where the sealing area is not disposed, for example, the valve driving section 15 (for example, a planar section of the valve driving section 15), which will be described below, may come in contact with the upper surface 6*b* of the upper plate 6 and air-tightly seal the opening section 52.

The valve driving section 15 (for example, a planar section of the valve driving section 15) comes in contact with the seal member 54. The opening section 52 is air-tightly sealed by a contact between the seal member 54 and the valve driving section 15.

In addition, the introduction valve IB includes a cavity (not shown, for the sake of convenience, referred to as a cavity 40B) having the same shape as that of the cavity 40A disposed in the substrate 9 to divide the introduction flow path 12B, and the valve part 50 disposed on the upper plate 6 to face the cavity 40B and configured to control an opening/closing state of the introduction flow path 12B according to deformation thereof. For example, the valve part 50 is elastically deformed to close the introduction flow path 12B when abutting the cavity 40B and open the introduction flow path 12B when separated from the cavity 40B. The introduction valve IC is disposed between the penetration section 39C and the circulation flow path 10 in the introduction flow path 12C. The introduction valve IC includes a cavity (not shown, for the sake of convenience, referred to as a cavity 40C) having the same shape as that of the cavity 40A disposed in the substrate 9 to divide the introduction flow path 12C, and the valve part 50 disposed on the upper plate 6 to face the cavity 40C and configured to control an opening/closing state of the introduction flow path 12C according to deformation thereof. For example, the valve part 50 is elastically deformed to close the introduction flow path 12C when abutting the cavity 40C and open the introduction flow path 12C when separated from the cavity 40C.

As shown in FIGS. 2 and 3, for example, the waste liquid tank 7 is disposed in a region inside a region in which the circulation flow path 10 is formed. Accordingly, reduction in size of the fluidic device 100A can be achieved. A tank suction hole (not shown) that opens towards the waste liquid tank 7 is formed in the upper plate 6 to penetrate the upper plate 6 in the thickness direction.

In FIG. 2, the discharge flow path 13A is a flow path configured to discharge the solution in the first fixed quantity division 18A in the circulation flow path 10 to the waste liquid tank 7. One end side of the discharge flow path 13A is connected to the circulation flow path 10. A position at which the discharge flow path 13A is connected to the circulation flow path 10 is in the vicinity of the fixed quantity valve VB in the first fixed quantity division 18A. The other end side of the discharge flow path 13A is connected to the waste liquid tank 7. In addition, the discharge flow path 13B is a flow path configured to discharge the solution in the second fixed quantity division 18B in the circulation flow path 10 to the waste liquid tank 7. One end side of the discharge flow path 13B is connected to the circulation flow path 10. A position at which the discharge flow path 13B is connected to the circulation flow path 10 is in the vicinity of the fixed quantity valve VC in the second fixed quantity division 18B. The other end side of the discharge flow path 13B is connected to the waste liquid tank 7. The discharge flow path 13C is a flow path configured to discharge the solution in the third fixed quantity division 18C in the circulation flow path 10 to the waste liquid tank 7. One end side of the discharge flow path 13C is connected to the circulation flow path 10. A position at which the discharge flow path 13C is connected to the circulation flow path 10 is in the vicinity of the fixed quantity valve VA in the third fixed quantity division 18C. The other end side of the discharge flow path 13C is connected to the waste liquid tank 7.

The waste liquid valve OA is disposed in the middle of the discharge flow path 13A (for example, midway, on the side of the circulation flow path 10). The waste liquid valve OA includes a cavity 41A (see FIG. 3) having a hemispherical shape and disposed in the substrate 9 to divide the discharge flow path 13A, and the valve part 50 disposed on the upper plate 6 to face the cavity 41A and configured to control an opening/closing state of the discharge flow path 13A according to deformation thereof. For example, the valve part 50 closes the discharge flow path 13A when it is elastically deformed and abuts the cavity 41A and opens the discharge flow path 13A when it is separated from the cavity 41A. The waste liquid valve OB is disposed in the middle of the discharge flow path 13B (for example, midway, on the side of the circulation flow path 10). The waste liquid valve OB includes a cavity (not shown, for convenience' sake, referred to as a cavity 41B) having the same shape as that of the cavity 41A disposed in the substrate 9 to divide the discharge flow path 13B, and the valve part 50 disposed on the upper plate 6 to face the cavity 41B and configured to control an opening/closing state of the discharge flow path 13B according to deformation thereof. For example, the valve part 50 closes the discharge flow path 13B when it is elastically deformed and abuts the cavity 41B and opens the discharge flow path 13B when it is separated from the cavity 41B. The waste liquid valve OC is disposed in the middle of the discharge flow path 13C (for example, midway, on the side of the circulation flow path 10). The waste liquid valve OC includes a cavity (not shown, for the sake of convenience, referred to as a cavity 41C) having the same shape as that of the cavity 41A disposed in the substrate 9 to divide the discharge flow path 13C, and the valve part 50 disposed on the upper plate 6 to face the cavity 41C and configured to control an opening/closing state of the discharge flow path 13C according to deformation thereof. For example, the valve part 50 closes the discharge flow path 13C when it is elastically deformed and abuts the cavity 41C and opens the discharge flow path 13C when it is separated from the cavity 41C.

The fluidic device 100A having the above-mentioned configuration is manufactured by forming the cavity 51, the opening section 52, the groove section 53, and so on, in the upper plate 6, integrating the upper plate 6 in which the cavity 51, the opening section 52, the groove section 53, and so on, are formed and the valve part 50 through two color molding (a double mold), which will be described below, (fixed to be immovable with respect to each other), forming the circulation flow path, the introduction flow path, the reservoir, the penetration section, and so on, in the substrate 9, and bonding and integrating the upper plate 6 and the substrate 9 by using a bonding means such as welding, bonding, laser welding, or the like (for example, the configuration in FIG. 1, or the like). In this way, for example, the upper plate 6 forms the above-mentioned various flow paths together with the cavity formed in the substrate 9, and serves for both leakage reduction of the solution and formation of the flow path.

A solution LA (see FIG. 2) is accommodated in the inlet 29A of the manufactured fluidic device 100A, a solution LB (see FIG. 2) is accommodated in the inlet 29B, and a solution LC (see FIG. 2) is accommodated in the inlet 29C. For example, injection of the solutions LA, LB and LC into the inlets 29A, 29B and 29C is performed from opening sections of the inlets 29A, 29B and 29C that open on the side of the lower surface 9a of the substrate 9.

The fluidic device 100A can be distributed to a place where mixing/reaction of the solutions LA, LB and LC is performed (for example, in an inspection institute, a hospital, a house, a vehicle, or the like) in a state in which the solution LA is accommodated in the inlet 29A, the solution LB is accommodated in the inlet 29B, the solution LC is accommodated in the inlet 29C, and for example, the lower surface 9a side of the substrate 9 is sealed by the seal member to seal the opening sections of the inlets 29A, 29B and 29C (for example, in a state in which the solutions are accommodated in the inlets, respectively). In this case, inlets (for example, the inlets 29A, 29B and 29C) are configured as reservoirs in which solutions (for example, the solutions LA, LB and LC) are accommodated.

First Embodiment of Method of Manufacturing Fluidic Device

Next, a method (a molding method) of integrating the upper plate (for example, a first molding section) 6 and the valve part (for example, a second molding section) 50 using a first mold M1 and a second mold M2 through two color molding will be described with reference to FIGS. 5 to 8. A mold opening/closing direction of a mold used when the upper plate 6 and the valve part 50 are formed may be a horizontal direction or a vertical direction. In the embodiment, as an example, the mold opening/closing direction will be described as a vertical direction. In addition, here, a place of the upper plate 6 at which the valve part 50 is installed will be shown and described.

Figure 5:
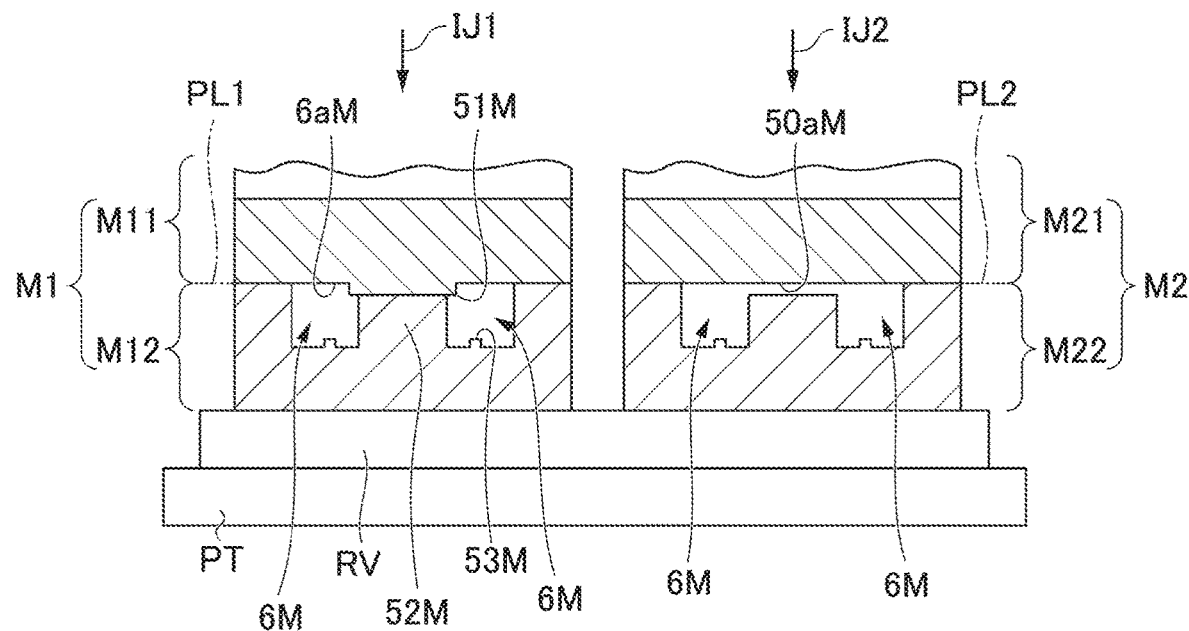
FIG. 5 is a cross-sectional view showing a schematic configuration of a first mold and a second mold according to the embodiment.

FIG. 5 is a cross-sectional view showing schematic configurations of the first mold M1 and the second mold M2. The first mold M1 includes a fixed mold M11 and a movable mold M12 that opens and closes at a parting line PL1 as a bonding surface. The fixed mold M11 is fixed to an upper platen (not shown) that includes a primary side shot end IJ1 in a molding machine. The movable mold M12 is fixed to a lower platen PT of the molding machine via an inverting machine RV.

The second mold M2 includes a fixed mold M21 and a movable mold M22 that opens and closes at a parting line PL2, which is flush with the parting line PL1, as a bonding surface. The fixed mold M21 is fixed to an upper platen (not shown) that includes a secondary side shot end IJ2 in the molding machine. The movable mold M22 is fixed to the lower platen PT of the molding machine via the inverting machine RV. The inverting machine RV inverts positions of the movable mold M12 and the movable mold M22 whenever one molding processing is terminated. That is, the movable mold M12 and the movable mold M22 invert and move in a first position where formation is performed using the primary side shot end IJ1 and the first mold M1 and a second position where formation is performed using the secondary side shot end IJ2 and the second mold M2, whenever one molding processing is performed. Further, in the following description, a mold installed on the side of the primary side shot end IJ1 is referred to as the first mold M1 having the fixed mold M11 and the movable mold M12, and a mold installed on the side of the secondary side shot end IJ2 is referred to as the second mold M2 having the fixed mold M21 and the movable mold M22.

While the fixed molds M11 and M21 may be any one mold type of a two-piece plate mold or a three-piece plate mold, the three-piece plate mold is preferable from a viewpoint in which a runner and a molded article can be separated when the first mold M1 and the second mold M2 are opened. Further, while flow paths (a runner section, a gate section, or the like) configured to guide a molten resin injected from the primary side shot end IJ1 and the secondary side shot end IJ2 are formed in the fixed molds M11 and M21, here, illustration of the flow paths is omitted.

The fixed mold M11 has a surface 6aM that forms the lower surface 6a of the upper plate 6, and a protrusion 51M that forms the cavity 51 of the upper plate 6. The movable mold M12 has a protrusion 52M that forms the opening section 52 of the upper plate 6, a protrusion 53M that forms the groove section 53 of the upper plate 6, and a cavity (an internal space) 6M that forms a majority part except the lower surface 6a and the cavity 51. A protrusion amount of the protrusion 51M is set to a value corresponding to the thickness of the valve part 50. The value corresponding to the thickness of the valve part 50 includes a value that becomes the thickness of the valve part 50 after a molten resin filled into the first mold M1 is cooled and contracted. Provided that a length of a molded article is L, shrinkage rate of a resin is r and a length of a mold is LM, the length of the mold is formed to a value represented as LM=(1+r)×L. In the following description, while a length (including a thickness, a depth, or the like) related to the mold will be described as being the same as the molded article for the sake of convenience, the length is formed on the basis of the above-mentioned equation in actuality.

A height of the protrusion 52M is set to a value that butts against the protrusion 51M when the first mold M1 is clamped.

The fixed mold M21 has a surface 50aM that forms a lower surface of the valve part 50 (a surface that is substantially flush with the lower surface 6a of the upper plate 6). The movable mold M22 is formed in the same shape as that of the movable mold M12.

Next, a procedure of forming the upper plate 6 and the valve part 50 using the first mold M1 and the second mold M2 will be described. For example, like the upper plate 6 formed of a hard material (for example, a material harder than the valve part 50) and the valve part 50 formed of a soft material (for example, a material softer than the upper plate 6 or the substrate 9), when the molded articles formed of different materials (for example, 2 kinds of materials) are thermally fused and integrated using the first mold M1 and the second mold M2 through two color molding, the molded article (a first molding section) molded by the first mold M1 forms a part of the member that constitutes a cavity (an internal space) in the second mold M2. For this reason, a melting point of the molded article molded by the first mold M1 is preferably higher than that of the molded article (a second molding section) molded by the second mold M2. For example, since the melting point of the above-mentioned hard material is about 165 to 250° C. and the melting point of the above-mentioned thermoplastic elastomer is about 85 to 120° C., in the embodiment, the upper plate 6 is molded by the first mold M1 and the valve part 50 is molded by the second mold M2. When the upper plate 6 and the valve part 50 are formed of a material (for example, a resin material) having compatibility, since a bonding strength of the molded upper plate 6 and the molded valve part 50 is increased, the upper plate 6 can be molded by the second mold M2 and the valve part 50 can be molded by the first mold M1 within a range in which flexibility of the valve part 50 is secured.

Figure 6:
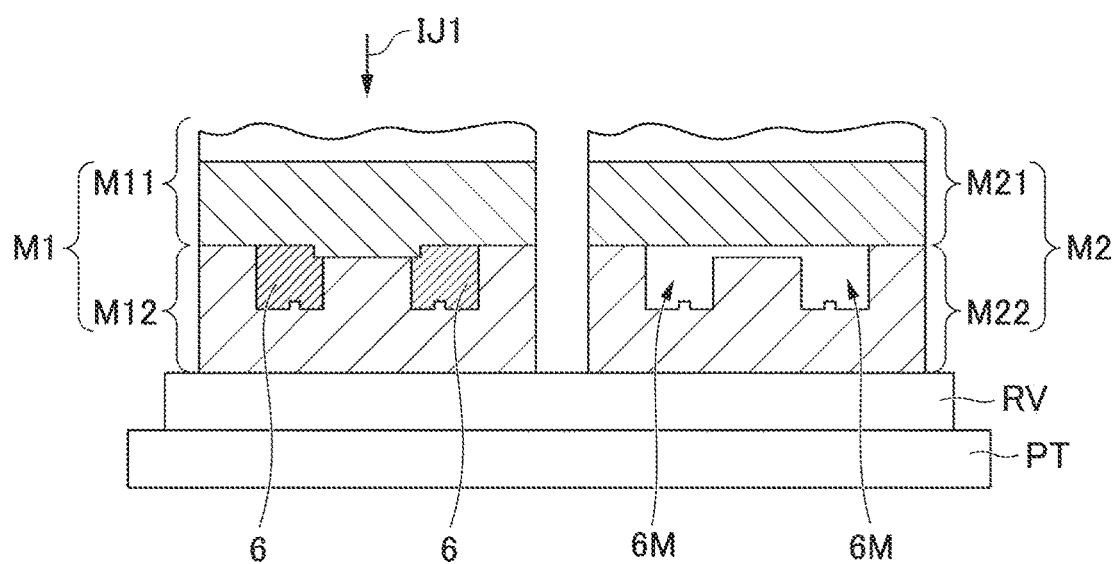
FIG. 6 is a view showing a procedure of two color molding according to the embodiment.

First, as shown in FIG. 6, in a state in which the fixed mold M11 and the movable mold M12 are clamped (a first mold clamped state), a cavity 6M is filled with the molten resin of the hard material that forms the upper plate 6 in the first mold M1 at the first position from the primary side shot end IJ1. Further, in first molding, since there is no molded article molded in the second mold M2, injection of the molten resin from the secondary side shot end IJ2 is not performed. The upper plate 6 (for example, the first molding section) can be formed on the side of the first mold M1 by cooling the molten resin filled into the first mold M1. When the upper plate 6 is molded by the first mold M1, the first mold M1 and the second mold M2 are opened, and the movable mold M12 of the first mold M1 at the first position and the movable mold M22 of the second mold M2 at the second position are inverted by the inverting machine RV.

Figure 7:
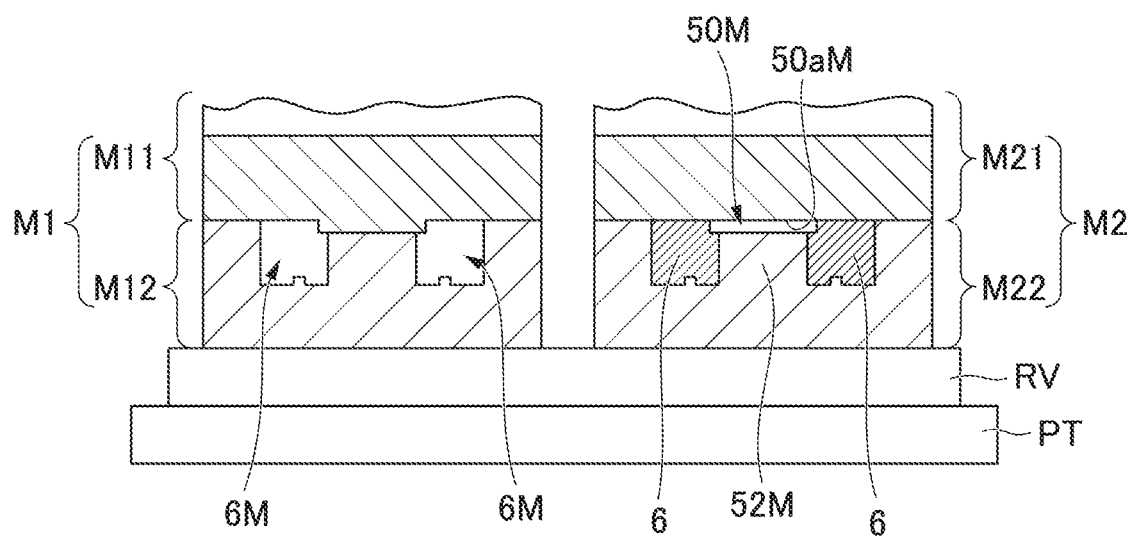
FIG. 7 is a view showing a procedure of two color molding according to the embodiment.

FIG. 7 shows the first mold M1 and the second mold M2 in a state in which the molds are clamped (a second mold clamped state) after a position of the movable mold M12 and a position of the movable mold M22 are inverted. As shown in FIG. 7, the upper plate 6 molded by the first mold M1 is installed inside the second mold M2 at the second position. A cavity (an internal space) 50M having the same shape as that of the valve part 50 is formed in the second mold M2 by the upper plate 6 molded by the first mold M1, the surface 50aM of the fixed mold M21 and the protrusion 52M of the movable mold M22. That is, the molded upper plate 6 is a part of the components that form the cavity (the internal space) 50M.

Figure 8:
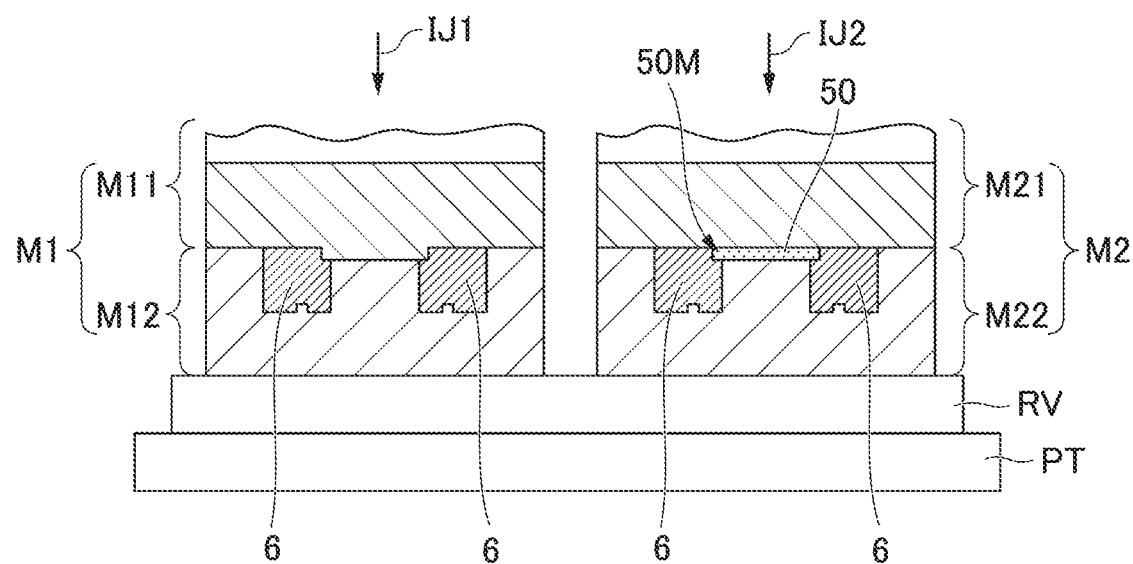
FIG. 8 is a view showing a procedure of two color molding according to the embodiment.

Next, as shown in FIG. 8, the cavity 6M of the first mold M1 at the first position is filled with the molten resin of the hard material from the primary side shot end IJ1, and the cavity 50M of the second mold M2 at the second position is filled with the molten resin of the soft material from the secondary side shot end IJ2. After that, when the molten resin is cooled, the upper plate 6 is molded by the first mold M1 and the valve part 50 (for example, the second molding section) thermally fused and integrated with the upper plate 6 is molded by the second mold M2. A molding of the upper plate 6 using the first mold M1 is performed simultaneously with a molding of integrating the upper plate 6 and the valve part 50 using the second mold M2. For example, a molding of the valve part 50 with respect to a part of the upper plate 6 while using the molded upper plate 6 and the second mold M2 and a molding of the upper plate 6 using the first mold M1 in which the valve part 50 is molded with respect to a part of the upper plate 6 upon molding using the second mold M2 after the previous molding, are simultaneously performed. In addition, for example, while using the second mold M2 and an either one of the molded base member (for example, the upper plate 6, the substrate 9 or the like) and the valve part 50, a molding of the other one of the base member and the valve part 50 with respect to a part of the either one of the base member and the valve part 50 valve part, and a molding of the either one of the base member and the valve part 50 using the first mold M1 upon molding after the previous molding, are simultaneously performed. After that, the upper plate 6 and the valve part 50 molded and integrated with (fixed to) each other through thermal fusion of different materials are obtained by opening the first mold M1 and the second mold M2 and releasing a molded article including a first molding section (for example, the upper plate 6 or the substrate 9 as a base member, a valve part) and a second molding section (for example, the upper plate 6 or the substrate 9 as a base member, a valve part) in the second mold M2. Hereinafter, inversion of the movable mold M12 of the first mold M1 at the first position and the movable mold M22 of the second mold M2 at the second position (movement of the upper plate 6 molded at the first position to the second position), simultaneously performing a molding of the upper plate 6 using the first mold M1 at the first position and a molding that thermal fuses and integrates the upper plate 6 and the valve part 50 using the second mold M2 at the second position, and a releasing of the molded article from the second mold M2, are repeatedly performed. In this way, for example, the fluidic device 100A is manufactured by resins formed of different materials among the members that constitutes the fluidic device 100A (for example, the upper plate 6, the valve part 50, and so on) through two color molding using the first mold M1 and the second mold M2. Further, for example, the method of manufacturing the fluidic device according to the embodiment includes a molding either one of a base member (for example, the upper plate 6, the substrate 9, or the like) and a valve part (for example, the valve part 50, a valve part 71, or the like, which will be described below) by using the first mold, and a molding the other of the base member and the valve part with respect to a part of the either one of the base member and the valve part by using the second mold and either one of the base member and the valve part that was molded. In addition, for example, the method of manufacturing the fluidic device according to the embodiment is a method of manufacturing a fluidic device including a flow path, the method including: a molding a first molding section using a first mold, a molding a second molding section using a second mold, and, in the molding using the second mold, integrally molding the first molding section and the second molding section by thermally fusing the second molding section with respect to at least a part of the first molding section.

Next, a procedure of bonding the upper plate 6 and the substrate 9 and integrating the upper plate 6 and the substrate 9 in a stacked shape will be described.

The upper plate 6 and the substrate 9 are bonded through, for example, ultrasonic welding. When bonding surfaces between the substrate 9 and the upper plate 6 are flat surfaces, even when ultrasonic vibrations are applied to the substrate 9 and the upper plate 6 that were stacked, since a contact surface is wide, and therefore, it may be difficult to obtain uniform and stable welding strength due to the melting-out position of the resin being uneven. For this reason, in the embodiment, the upper plate 6 and the substrate 9 are bonded to each other through ultrasonic welding via an energy director section protruding from a position surrounding (for example, around) a cavity including flow paths (for example, the circulation flow path 10, the introduction flow paths 12A, 12B and 12C, the discharge flow paths 13A, 13B and 13C, and the waste liquid tank 7). For example, while the energy director section may be formed on either of the bonding surfaces of the substrate 9 or the upper plate 6 when the cavities (for example, the circulation flow path 10, the introduction flow paths 12A, 12B and 12C, the discharge flow paths 13A, 13B and 13C, and the waste liquid tank 7) are formed in the upper surface 9b of the substrate 9 and the flow paths are formed by bonding the upper plate 6 to the upper surface 9b of the substrate 9, in order to maintain a relative positional relation between the cavity (for example, the circulation flow path 10, the introduction flow paths 12A, 12B and 12C, the discharge flow paths 13A, 13B and 13C, the waste liquid tank 7) and the energy director section, it is preferable to form the energy director section on the substrate 9 on which the cavity (for example, the circulation flow path 10, the introduction flow paths 12A, 12B and 12C, the discharge flow paths 13A, 13B and 13C, or the waste liquid tank 7) is formed and to simultaneously form the cavity (for example, the circulation flow path 10, the introduction flow paths 12A, 12B and 12C, the discharge flow paths 13A, 13B and 13C, or the waste liquid tank 7) and the energy director section, for example, when the substrate 9 is manufactured through injection molding.

Figure 9:
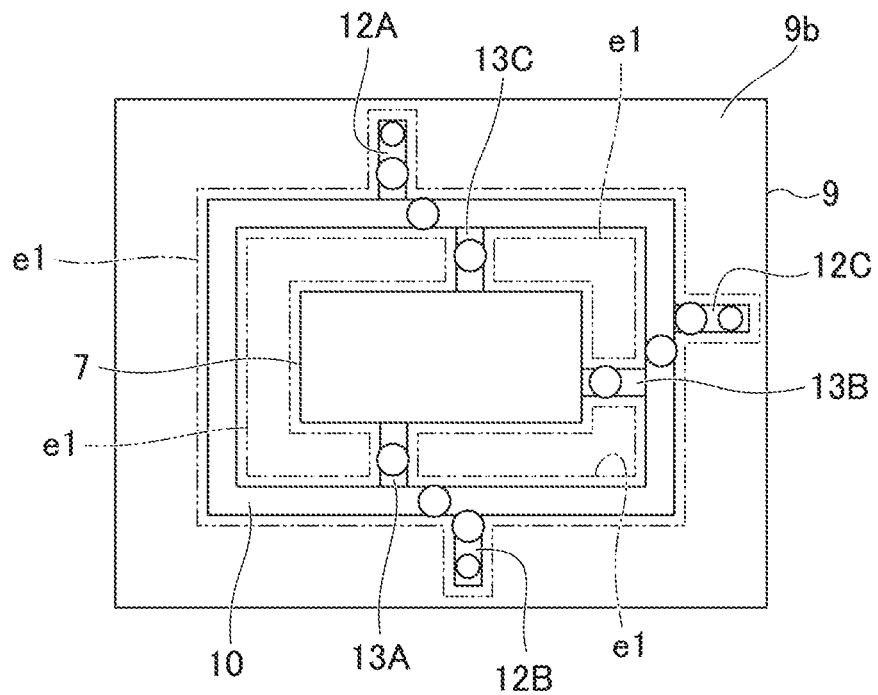
FIG. 9 is a plan view of a substrate according to the embodiment.

Here, in the embodiment, as shown in FIG. 9, the energy director section e1 protruding from a position surrounding the cavity (for example, the circulation flow path 10, the introduction flow paths 12A, 12B and 12C, the discharge flow paths 13A, 13B and 13C, and the waste liquid tank 7) is formed on the upper surface 9b of the substrate 9.

Figure 10:
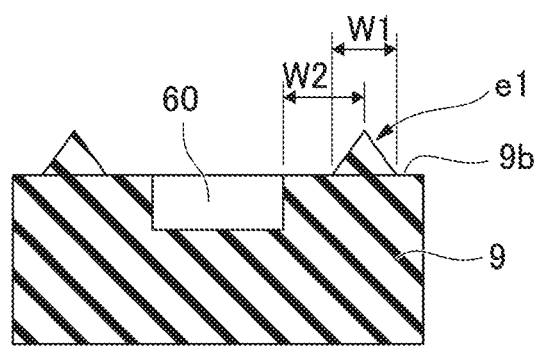
FIG. 10 is a cross-sectional view of the substrate on which an energy director section according to the embodiment is installed.

FIG. 10 is a cross-sectional view of the substrate 9 on which the energy director section e1 is formed. In FIG. 10, for example, the circulation flow path 10, the introduction flow paths 12A, 12B and 12C, the discharge flow paths 13A, 13B and 13C, and the waste liquid tank 7 are representatively shown as a cavity 60.

As shown in FIG. 10, each of the energy director sections e1 is formed in a triangular shape having a tapered tip when seen in a cross-sectional view. The energy director section e1 is formed in, for example, an equilateral triangular cross-section having a length of one side of several hundreds μm. A distance W2 from a tip portion of the energy director section e1 to the cavity 60 is, for example, several hundreds of μm.

Figure 12:
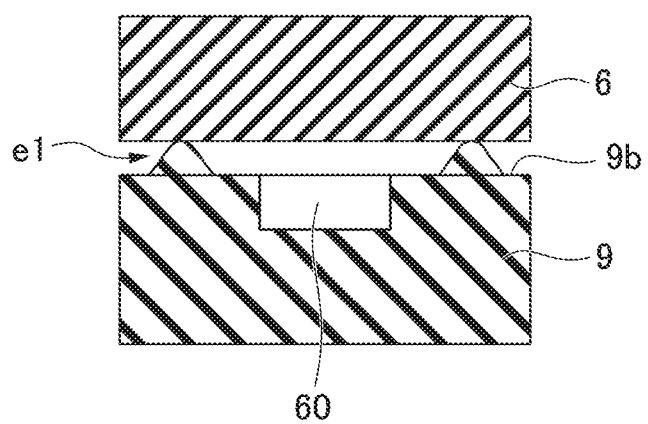
FIG. 12 is a view showing a procedure of manufacturing the fluidic device according to the embodiment through welding.
Figure 13:
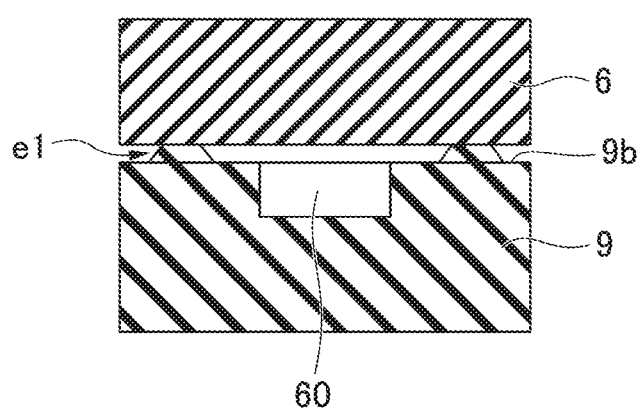
FIG. 13 is a view showing a procedure of manufacturing the fluidic device according to the embodiment through welding.

Next, a procedure of bonding the upper plate 6 and the substrate 9 through ultrasonic welding will be described with reference to FIGS. 11 to 13.

Figure 11:
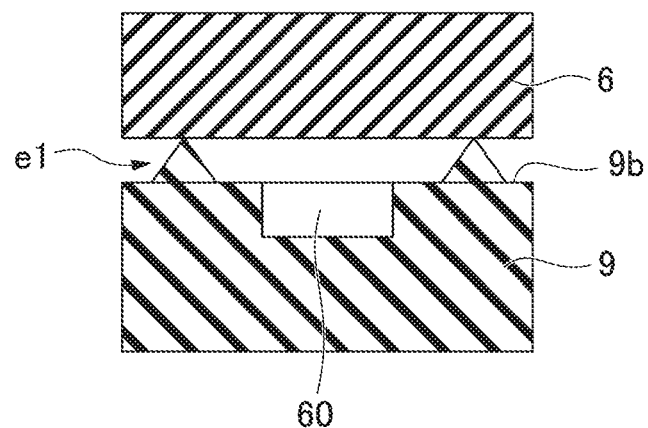
FIG. 11 is a view showing a procedure of manufacturing the fluidic device according to the embodiment through welding.

First, as shown in FIG. 11, the substrate 9 and the upper plate 6 are positioned with respect to each other in a surface direction and stacked in a state in which the upper plate 6 comes in contact with the energy director section e1 by inserting a shaft member into positioning holes of the substrate 9 and the upper plate 6. Then, in a state in which one sides of the substrate 9 and the upper plate 6 are supported, while applying a vibrational energy to the other sides of the substrate 9 and the upper plate 6 by having a horn come into contact with thereto, a strong frictional heat is generated in a boundary surface through friction between the energy director section e1 and the upper plate 6 due to the transmitted vibrational energy. The vibrational energy is concentrated to the energy director section e1 because a cross-sectional area of the energy director section e1 is smaller than that of the upper plate 6, and as shown in FIG. 12, the energy director section e1 is heated and melted from a tip side to a resin melting temperature due to the generated frictional heat in a short time. After that, while the substrate 9 and the upper plate 6 are welded and integrated through cooling, as shown in FIG. 13, the energy director section e1 may remain as a welding mark having a small thickness even after the welding because an area of a base section is larger than that of a tip portion and concentration of the vibrational energy is attenuated.

In this way, as shown in FIG. 1, the fluidic device 100A in which the upper plate 6 and the substrate 9 are stacked and integrated is manufactured. Further, the energy director section e1 may be previously formed on the upper plate 6 or the substrate 9 as a preparing process before the fluidic device 100A is manufactured.

Next, a procedure of performing mixing/reaction of the solutions LA, LB and LC using the fluidic device 100A will be described with reference to the above-mentioned FIGS. 1 to 4. First, a procedure of introducing the solution LA into the first fixed quantity division 18A and quantifying the introduced solution LA will be described.

First, the fixed quantity valves VA and VB of the circulation flow path 10 are closed, the waste liquid valves OB and OC of the discharge flow paths 13B and 13C are closed, and the waste liquid valve OA of the discharge flow path 13A and the introduction valve IA of the introduction flow path 12A are opened.

Control of the opening/closing state of the valve is performed through deformation of the valve. For example, as shown in FIG. 4, closing of the valve is performed by the valve part 50 being displaced and contacting the cavity 40A due to a positive pressure applied by the valve driving section 15 that air-tightly seals the opening section 52 due to a contact with the seal member 54 via the opening section 52. In addition, opening of the valve is performed by releasing application of the positive pressure by the valve driving section 15 and by a separation of the valve part 50 from the cavity 40A when the displacement of the valve part 50 is solved. The opening and closing of the various valves that will be described below are the same as above.

Accordingly, the circulation flow path 10 is in a state in which the first fixed quantity division 18A is divided with respect to the second fixed quantity division 18B and the third fixed quantity division 18C. In addition, the waste liquid tank 7 is shielded from the discharge flow paths 13B and 13C and opened and connected to the first fixed quantity division 18A of the circulation flow path 10 via the discharge flow path 13A. Further, the inlet 29A is opened and connected to the first fixed quantity division 18A of the circulation flow path 10 via the penetration section 39A and the introduction flow path 12A.

In this state, since the inside of the waste liquid tank 7 is suctioned from the tank suction hole at a negative pressure, the solution LA accommodated in the inlet 29A is introduced in sequence of the penetration section 39A, the introduction flow path 12A, the first fixed quantity division 18A of the circulation flow path 10, the discharge flow path 13A and the waste liquid tank 7. While foreign substances may remain in the flow paths in which the solution LA is introduced into the waste liquid tank 7, since the foreign substances are caught on the introduction tip of the solution LA upon introduction of the solution and flow into the waste liquid tank 7, the possibility of the foreign substances remaining in the circulation flow path 10 can be minimized.

Then, the waste liquid valve OA and the introduction valve IA are closed in a state in which the solution LA at the introduction tip side flows into the waste liquid tank 7 and the solution LA at the introduction rear end side remains in the introduction flow path 12A. Accordingly, the solution LA can be quantified according to the volume of the first fixed quantity division 18A. As described above, since the solution LA on the introduction tip side in which the foreign substances may be present is discharged to the waste liquid tank 7 and bubbles remain in the inlet 29A, the solution LA with which the foreign substances or bubbles are not mixed is quantified in the first fixed quantity division 18A of the circulation flow path 10.

Next, in order to introduce and quantify the solution LB in the second fixed quantity division 18B, first, the fixed quantity valves VB and VC of the circulation flow path 10 are closed, the waste liquid valves OA and OC of the discharge flow paths 13A and 13C are closed, and the waste liquid valve OB of the discharge flow path 13B and the introduction valve IB of the introduction flow path 12B are opened. Accordingly, the circulation flow path 10 is in a state in which the second fixed quantity division 18B is divided from the first fixed quantity division 18A and the third fixed quantity division 18C. In addition, the waste liquid tank 7 is blocked with respect to the discharge flow paths 13A and 13C, and opened and connected to the second fixed quantity division 18B of the circulation flow path 10 via the discharge flow path 13B. Further, the inlet 29B is opened and connected to the second fixed quantity division 18B of the circulation flow path 10 via the penetration section 39B and the introduction flow path 12B.

In this state, since the inside of the waste liquid tank 7 is suctioned from the tank suction hole at a negative pressure, the solution LB accommodated in the inlet 29B is introduced in sequence of the penetration section 39B, the introduction flow path 12B, the second fixed quantity division 18B of the circulation flow path 10, the discharge flow path 13B and the waste liquid tank 7. Even in the solution LB, since the foreign substances remaining in the flow paths in which the solution LB is introduced into the waste liquid tank 7 is caught on the introduction tip side of the solution LB upon introduction of the solution and flows into the waste liquid tank 7, probability of remaining the foreign substances in the circulation flow path 10 can be minimized.

Then, the waste liquid valve OB and the introduction valve IB are closed in a state in which the introduction tip side of the solution LB flows into the waste liquid tank 7 and the introduction rear end side of the solution LB remains in the introduction flow path 12B. Accordingly, the solution LB can be quantified according to the volume of the second fixed quantity division 18B. As described above, since the solution LB on the introduction tip side in which the foreign substances may be present is discharged to the waste liquid tank 7 and the bubbles remain in the inlet 29B, the solution LB with which the foreign substances or bubbles are not mixed is quantified in the second fixed quantity division 18B of the circulation flow path 10.

Next, in introducing and quantifying the solution LC in the third fixed quantity division 18C, first, the fixed quantity valves VA and VC of the circulation flow path 10 are closed, the waste liquid valves OA and OB of the discharge flow paths 13A and 13B are closed, and the waste liquid valve OC of the discharge flow path 13C and the introduction valve IC of the introduction flow path 12C are opened. Accordingly, the circulation flow path 10 is in a state in which the third fixed quantity division 18C is divided from the first fixed quantity division 18A and the second fixed quantity division 18B. In addition, the waste liquid tank 7 is blocked with respect to the discharge flow paths 13A and 13B and opened and connected to the third fixed quantity division 18C of the circulation flow path 10 via the discharge flow path 13C. Further, the inlet 29C is opened and connected to the third fixed quantity division 18C of the circulation flow path 10 via the penetration section 39C and the introduction flow path 12C.

In this state, since the inside of the waste liquid tank 7 is suctioned from the tank suction hole at a negative pressure, the solution LC accommodated in the inlet 29C is introduced in sequence of the penetration section 39C, the introduction flow path 12C, the third fixed quantity division 18C of the circulation flow path 10, the discharge flow path 13C and the waste liquid tank 7. Also in the solution LC, since the foreign substances remaining in the flow paths in which the solution LC is introduced into the waste liquid tank 7 are caught on the introduction tip side of the solution LC upon introduction of the solution and flows into the waste liquid tank 7, the possibility of the foreign substances remaining in the circulation flow path 10 can be minimized.

Then, the waste liquid valve OC and the introduction valve IC are closed in a state in which the introduction tip side of the solution LC flows into the waste liquid tank 7 and the introduction rear end side of the solution LC remains in the introduction flow path 12C. Accordingly, the solution LC can be quantified according to the volume of the third fixed quantity division 18C. As described above, since the solution LC on the introduction tip side in which the foreign substances may be present is discharged to the waste liquid tank 7 and bubbles remain in the inlet 29C, the solution LC with which the foreign substances or bubbles are not mixed is quantified in the third fixed quantity division 18C of the circulation flow path 10.

After the solutions LA, LB and LC are quantified and introduced into the circulation flow path 10, the solutions LA, LB and LC in the circulation flow path 10 are delivered and circulated using a pump. In the solutions LA, LB and LC that circulate through the circulation flow path 10, due to a mutual action (friction) between the flow path wall surface in the flow path and the solution, a flow velocity around the wall surface becomes slow, and a flow velocity at a center of the flow path becomes fast. As a result, since a distribution in the flow velocities of the solutions LA, LB and LC are generated, mixing of the solution can be promoted. For example, a convection current is generated and mixing of the plurality of solutions LA, LB and LC is promoted in the solutions LA, LB and LC in the circulation flow path 10 by driving the pump. The pump may be a pump valve that can deliver a solution by opening and closing the valve.

As described above, in the method of manufacturing the fluidic device 100A of the embodiment, since the upper plate 6 and the valve part 50 formed of different materials are thermally fused and integrated (fixed to each other) through two color molding using the first mold M1 and the second mold M2, the upper plate 6 and the valve part 50 can be integrated without consuming labors and time like when a sheet material having flexibility is adhered and without causing a problem in desired opening and closing of the flow path. In addition, in the method of manufacturing the fluidic device 100A of the embodiment, since the upper plate 6 and the substrate 9 are bonded via the energy director section e1 formed around the cavity 60 through ultrasonic welding, a melting-out position of the resin can be uniformized, and the upper plate 6 and the substrate 9 can be bonded and integrated with a uniform and stable welding strength. In addition, in the method of manufacturing the fluidic device 100A of the embodiment, since the energy director section e1 is provided on the substrate 9 in which the cavity 60 is formed, the cavity 60 and the energy director section e1 can be formed through the same process, and a relative positional relation between the cavity 60 and the energy director section e1 can be held with high accuracy.

Second Embodiment of Valve

Figure 14:
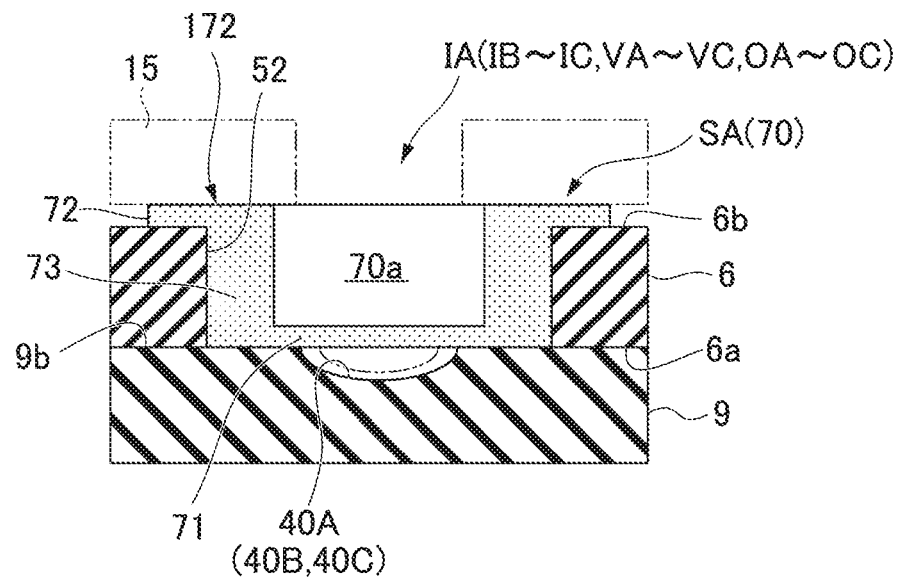
FIG. 14 is a cross-sectional view showing a configuration of an introduction valve according to the embodiment.

FIG. 14 is a cross-sectional view showing a configuration of an introduction valve IA as a second embodiment of the valve. Further, a configuration of each of the above-mentioned other valves (for example, the introduction valves IB and IC, the fixed quantity valves VA, VB and VC and the waste liquid valves OA, OB and OC) may be the same as the configuration of the introduction valve IA of the embodiment. In FIG. 14, the same components as those of the first embodiment of the valve shown in FIG. 4 are designated by the same reference characters, and description thereof will be omitted.

A valve driven section 70 shown in FIG. 14 is formed of the same soft material as that of the valve part 50, and includes a valve part (a deformation section) 71, a seal section (an extension section) 72 and a cylindrical section (a connecting section) 73. The valve driven section 70 including the valve part 71, the seal section 72 and the cylindrical section 73 is integrally formed of the same material (single material) as a single member. The valve part 71 closes the opening section 52 on the side of the lower surface 6a of the upper plate 6. For example, the seal section 72 formed in a flange shape is integrally and simultaneously (to be described below in detail) formed as a single member together with the valve part 71, formed to cover the opening section 52, and extends (overhangs) over the upper surface 6b of the upper plate 6 in a direction (for example, a radial direction) away from the opening section 52. The cylindrical section 73 is formed along an inner circumferential surface of the opening section 52, integrally connected to the seal section 72 at an upper end, and integrally connected to the valve part 71 at a lower end. An internal space of the cylindrical section 73 has an opening section 70a with a lower end that is closed by the valve part 71 and an upper end that is open. The seal section 72 is formed in a frame shape to surround the opening section 70a. For example, one surface of the seal section 72 has an abutting section 172 to which the above-mentioned valve driving section 15 (for example, a planar section of the valve driving section 15) abuts to be closely attached. The opening section 70a is airtightly sealed when the valve driving section 15 abuts the abutting section 172. The seal section 72 constitutes the sealing area SA that airtightly seals the opening section 70a when the valve driving section 15 abuts the abutting section 172. In addition, for example, the cylindrical section 73 has a shape having a cavity or a space (for example, an operation space of the valve part 71), and a shape such as a circular cylindrical shape, a polygonal cylindrical shape, or the like.

Next, a method (a molding method) of integrating the upper plate 6 and the valve driven section 70 through two color molding using the first mold M1 and the second mold M2 will be described with reference to FIGS. 16 to 19. In FIGS. 16 to 19, the same components as those when the upper plate 6 and the valve part 50 are formed through two color molding as shown in FIGS. 5 to 8 are designated by the same reference characters, and description thereof will be omitted. In addition, while a mold opening/closing direction in the mold used when the upper plate 6 and the valve driven section 70 are molded is any one of a horizontal direction or a vertical direction, for example, in the embodiment, the mold opening/closing direction will be described as the vertical direction. In addition, here, a place in the upper plate 6 at which the valve driven section 70 is formed will be shown and described.

Figure 16:
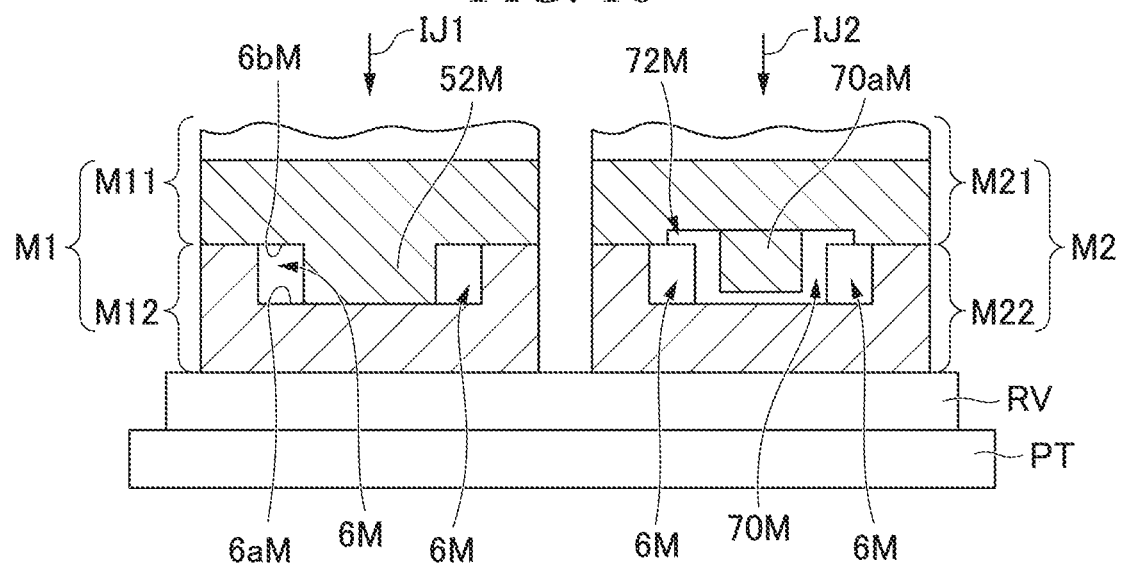
FIG. 16 is a cross-sectional view showing a schematic configuration of the first mold and the second mold according to the embodiment.

FIG. 16 is a cross-sectional view showing a schematic configuration of the first mold M1 and the second mold M2 to form the upper plate 6 and the valve driven section 70 through two color molding. The fixed mold M11 of the first mold M1 has a surface 6bM that forms the upper surface 6b of the upper plate 6 and a protrusion 52M that forms the opening section 52 of the upper plate 6. A protrusion amount of the protrusion 52M is set to a value corresponding to a thickness of the upper plate 6. The movable mold M12 has the cavity (the internal space) 6M that forms most part of the upper plate 6 except the upper surface 6b and the opening section 52. A depth of the cavity 6M is set to a value corresponding to the thickness of the upper plate 6.

The fixed mold M21 has a cavity 72M having a shape and a depth corresponding to a shape and a thickness of the seal section 72 of the valve driven section 70, and a protrusion 70aM having a shape and a protrusion amount corresponding to a shape and a depth of the opening section 70a of the valve driven section 70. The movable mold M22 is formed in the same shape as that of the movable mold M12.

Next, a procedure of molding the upper plate 6 and the valve driven section (for example, the second molding section) 70 using the first mold M1 and the second mold M2 will be described.

Figure 17:
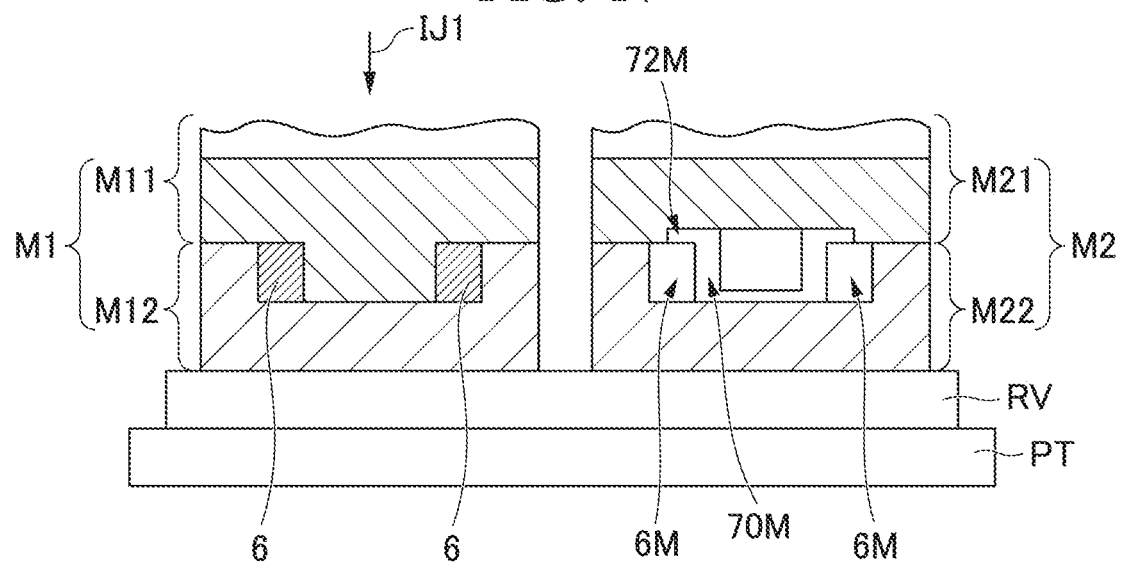
FIG. 17 is a view showing a procedure of two color molding according to the embodiment.

First, as shown in FIG. 17, in the first mold clamped state, the cavity 6M is filled with the molten resin formed of a hard material for molding the upper plate 6 in the first mold M1 from the primary side shot end IJ1. Further, in first molding, since there is no molded article molded in the second mold M2, injection of the molten resin from the secondary side shot end IJ2 is not performed. The upper plate 6 is molded by cooling the molten resin filled into the first mold M1. When the upper plate 6 is molded by the first mold M1, the first mold M1 and the second mold M2 are opened, and a position of the movable mold M12 in the first mold M1 and a position of the movable mold M22 in the second mold M2 are inverted by the inverting machine RV.

Figure 18:
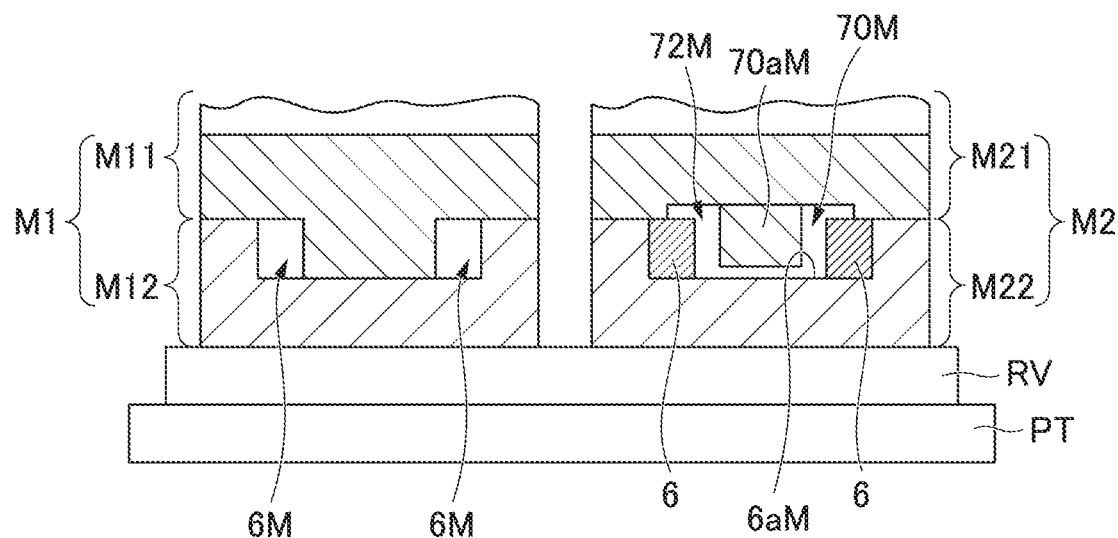
FIG. 18 is a view showing a procedure of two color molding according to the embodiment.

FIG. 18 shows the first mold M1 and the second mold M2 in a state in which the position of the movable mold M12 and the position of the movable mold M22 are inverted and the molds are clamped (a second mold clamped state). As shown in FIG. 18, the upper plate 6 molded by the first mold M1 is installed in the second mold M2. In the second mold M2, a cavity (an internal space) 70M having the same shape as that of the valve driven section 70 is formed by the upper plate 6 molded by the first mold M1, the cavity 72M and the protrusion 70aM of the fixed mold M21, and a surface 6aM of the movable mold M22. That is, the molded upper plate 6 is a part of the components that form the cavity (the internal space) 70M.

Figure 19:
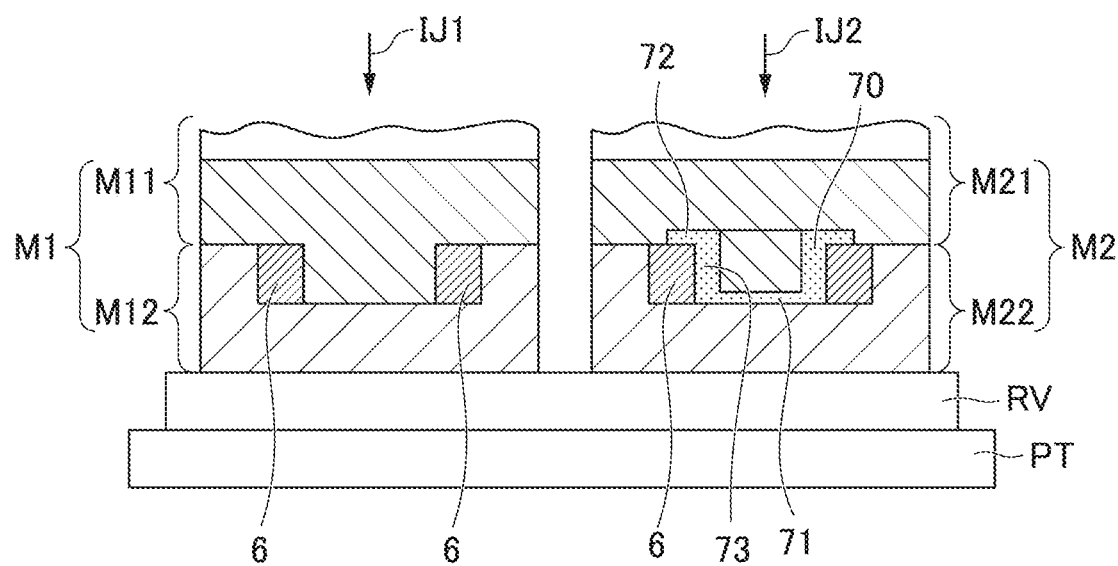
FIG. 19 is a view showing a procedure of two color molding according to the embodiment.

Next, as shown in FIG. 19, the cavity 6M of the first mold M1 is filled with the molten resin formed of a hard material from the primary side shot end IJ1, and the cavity 70M of the second mold M2 is filled with the molten resin formed of a soft material from the secondary side shot end IJ2. After that, the upper plate 6 is molded in the first mold M1 and the valve driven section 70 thermally fused and integrated with the upper plate 6 is molded in the second mold M2 by cooling the molten resin. For example, the valve part 71, the seal section 72 and the cylindrical section 73 are simultaneously molded in the second mold M2. After that, the upper plate 6 and the valve driven section 70 that are formed using different materials with each other and that are integrated (fixed to each other) are obtained by opening the first mold M1 and the second mold M2 and releasing the molded article in the second mold M2.

In the valve driven section 70 having the above-mentioned configuration, an opening/closing state of the flow path (for example, the cavity 40A) is controlled according to deformation of the valve part 71. For example, since the valve driving section 15 that airtightly seals the opening section 70a due to a contact with the seal section 72 applies a positive pressure via the opening section 70a, the flow path (for example, the cavity 40A) is closed as the valve part 71 is displaced toward the cavity 40A and comes in contact with the cavity 40A (a state in which the valve is closed). In addition, since the valve driven section 70 releases application of the positive pressure due to the valve driving section 15, the flow path (for example, the cavity 40A) is opened as displacement of the valve part 71 is solved and the valve part 71 is separated from the cavity 40A (a state in which the valve is open).

Accordingly, in the valve driven section 70, since the sealing area SA configured to airtightly seal the opening section 70a is formed by the seal section 72, it is not necessary to provide a separate seal member, and thus, simplification and reduction in time of a device manufacturing process can be achieved without necessity of providing a separate seal member, in addition to obtaining of the same action and effect as in the valve part 50 of the first embodiment. For example, when the fluidic device has a configuration including the seal section 72, the fluidic device according to the embodiment can reduce necessity of using the seal member for a fluidic device installed on the side of the apparatus including the valve driving section 15 or the like and further reduce mixing of foreign substances into the flow path or the like of the fluidic device. Further, the fluidic device according to the embodiment may have a configuration in which a groove section configured to dispose a seal member (for example, an O-ring) is disposed in addition to the seal section 72.

Figure 15:
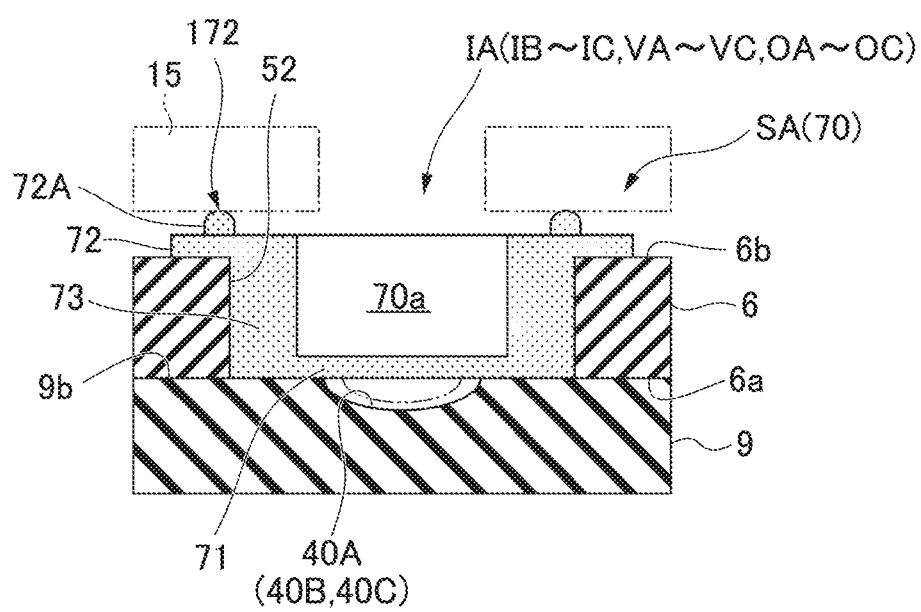
FIG. 15 is a cross-sectional view showing a configuration of the introduction valve according to the embodiment.

Further, as shown in FIG. 15, a configuration in which a rib-shaped protrusion 72A protruding upward around the opening section 70a throughout the circumference (in an annular shape in the radial direction) is formed at a position in the upper surface of the seal section 72 further outside than the opening section 52 may be provided as the valve driven section 70. For example, as the configuration is employed, a contact area in the abutting section 172 constituted by a tip portion of the protrusion 72A with the valve driving section 15 can be reduced, and a contact pressure for airtightly sealing an opening section 7a can be reduced. When the valve driven section 70 having the protrusion 72A is molded using the first mold M1 and the second mold M2, a cavity having a shape and a depth corresponding to the shape and the protrusion amount of the protrusion 72A may be formed in the cavity 72M.

Third Embodiment of Valve

Figure 20:
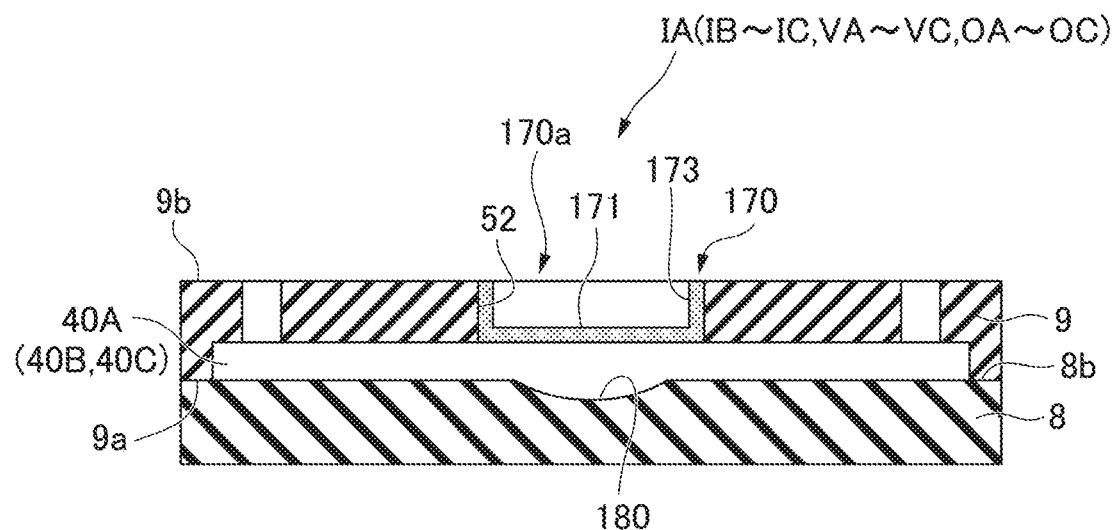
FIG. 20 is a cross-sectional view showing a configuration of the introduction valve according to the embodiment.

FIG. 20 is a cross-sectional view showing a configuration of an introduction valve IA as a third embodiment of the valve. Further, a configuration of each of the above-mentioned other valves (for example, the introduction valves IB and IC, the fixed quantity valves VA, VB and VC and the waste liquid valves OA, OB and OC) may be the same as the configuration of the introduction valve IA of the embodiment. In FIG. 20, the same components as those of the second embodiment of the valve shown in FIG. 14 are designated by the same reference character, and description thereof will be omitted.

As shown in FIG. 20, the substrate 9 has a cavity (for example, the flow path) 40A formed in a lower surface (one surface) 9a, and an opening section 52 that opens (penetrates) to a bottom section of the cavity 40A (for example, an upper side of the cavity 40A in FIG. 20) and an upper surface (the other surface) 9b of the substrate 9. A valve driven section 170 is formed in the opening section 52. The valve driven section 170 is formed of the same soft material as that of the above-mentioned valve part 50, and includes a valve part (a deformation section) 171 and a cylindrical section (a connecting section) 173. The valve part 171 closes the opening section 52 on the side of the lower surface 9a of the substrate 9. For example, the cylindrical section 173 is constituted by a single member together with the valve part 171, formed along an inner circumferential surface of the opening section 52, and integrally connected to the valve part 171 at a lower end. An internal space of the cylindrical section 173 has an opening section 170a having a lower end closed by the valve part 171 and an upper end that opens. For example, when the cavity 40A in FIG. 20 is a flow path, the flow path is configured such that a fluid (for example, a solution including a specimen material, a cleaning liquid, and so on) flows from a left side toward a right side in the drawing.

The lower surface 9a of the substrate 9 is bonded to an upper surface 8b of a lower plate 8. A concave surface 180 having a curved surface shape (for example, a hemispherical shape) is formed at a position on the upper surface 8b facing the cavity 40A.

Figure 21:
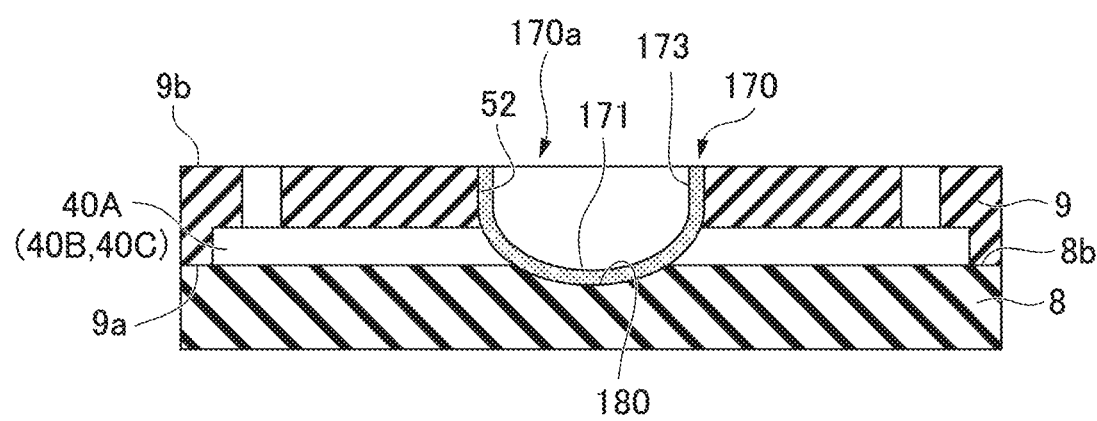
FIG. 21 is a cross-sectional view showing a configuration of the introduction valve according to the embodiment.

The valve driven section 170 having the above-mentioned configuration controls an opening/closing state of the flow path (for example, the cavity 40A) according to deformation of the valve part 171, for example, when a force (for example, a pneumatic pressure, a liquid pressure, a mechanical force, or the like) is added to below of the valve part 171 via the opening section 170a. As an example, as shown in FIG. 21, the flow path (for example, the cavity 40A) is closed (a state in which the valve is closed) as the valve part 171 is deformed and displaced toward the cavity 40A and comes in contact with the concave surface 180. In addition, in the valve driven section 170, deformation (for example, displacement) of the valve part 171 is solved as application of the downward force to the valve part 171 is released, and the flow path (for example, the cavity 40A) is opened (a state in which the valve is open) as separated from the concave surface 180.

Next, a method (a molding method) of integrating the substrate 9 including the cavity 40A (for example, the flow path) and the valve driven section 170 using the first mold M1 and the second mold M2 through two color molding will be described with reference to FIGS. 22 to 27. In the drawings, the same components as those when the upper plate 6 and the valve driven section 70 shown in FIGS. 16 to 19 are formed through two color molding, and description thereof will be omitted. In addition, while the mold opening/closing direction of the mold when the substrate 9 and the valve driven section 170 are molded may be any one of the horizontal direction or the vertical direction, as an example, the embodiment will be described using the mold opening/closing direction as the vertical direction. In addition, here, a place in the substrate 9 at which the valve driven section 170 is formed is shown and described.

Figure 22:
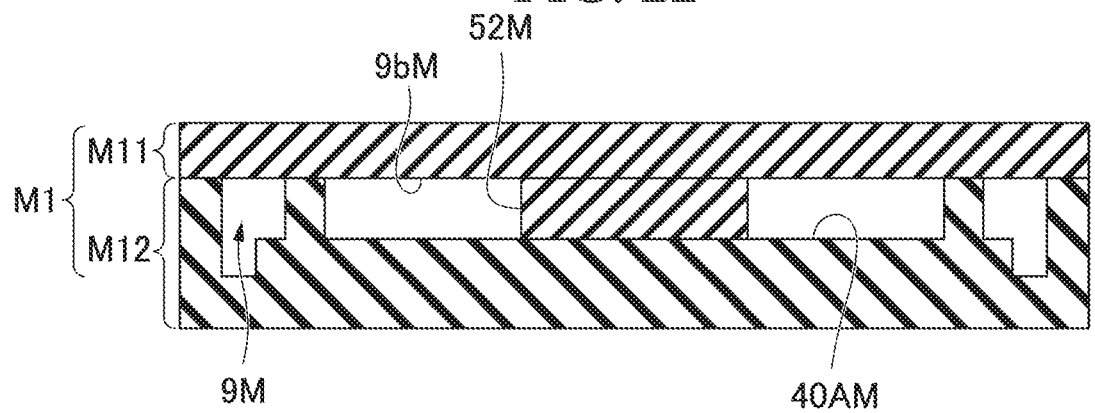
FIG. 22 is a cross-sectional view showing a schematic configuration of the first mold according to the embodiment.
Figure 23:
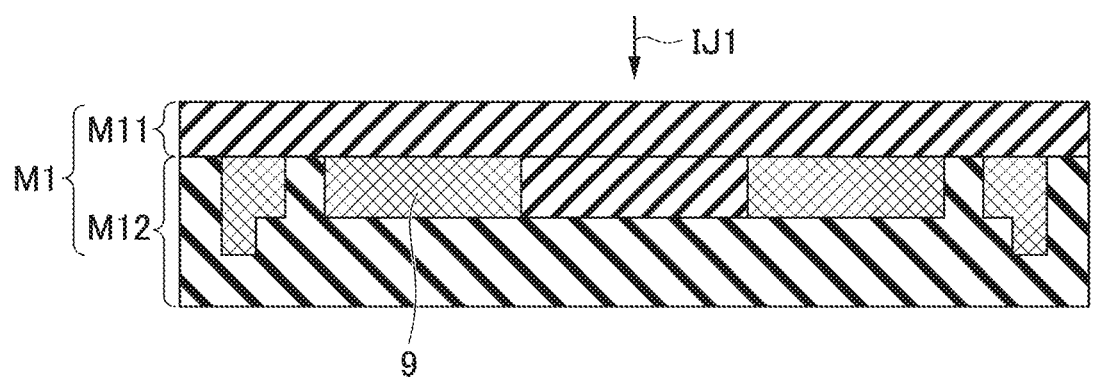
FIG. 23 is a view showing a procedure of two color molding according to the embodiment.
Figure 24:
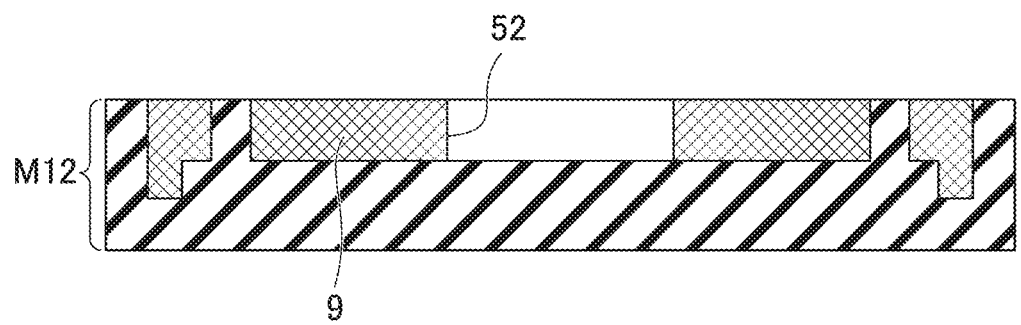
FIG. 24 is a view showing a procedure of two color molding according to the embodiment.

FIGS. 22 to 24 are cross-sectional views showing a schematic configuration of the first mold M1 for molding the substrate 9 and the valve driven section 170 through two color molding. The fixed mold M11 of the first mold M1 has a surface 9bM that forms the upper surface 9b of the substrate 9, and a protrusion 52M that forms the opening section 52 of the substrate 9. A protrusion amount of the protrusion 52M is set to a value corresponding to a distance from a bottom section of the cavity 40A to the upper surface 9b in the substrate 9. The movable mold M12 has a protrusion 40AM that forms the cavity 40A, and a cavity (an internal space) 9M that forms most part of the substrate 9 except the upper surface 9b and the opening section 52. A depth of the cavity 9M is set to a value corresponding to a thickness of the substrate 9.

Figure 25:
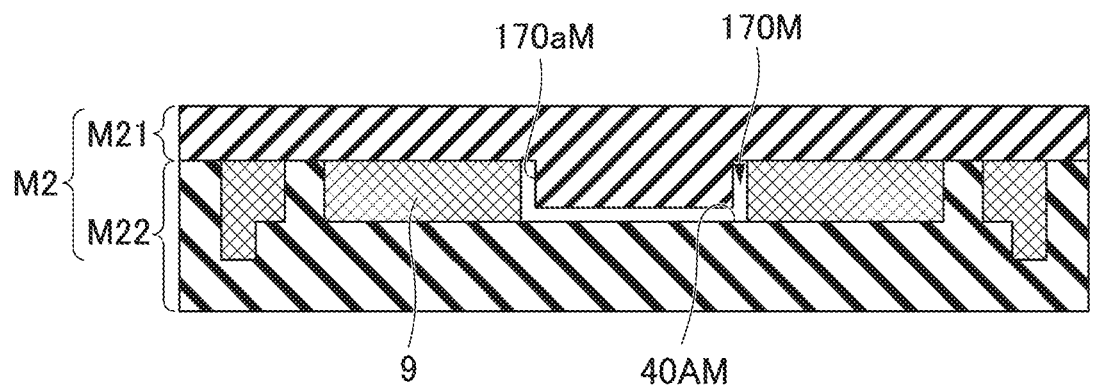
FIG. 25 is a cross-sectional view showing a schematic configuration of the second mold according to the embodiment.
Figure 26:
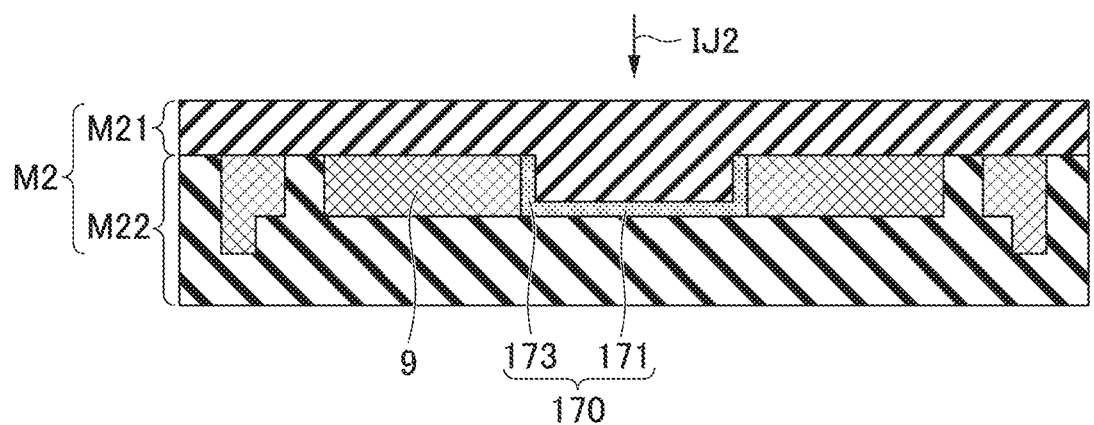
FIG. 26 is a view showing a procedure of two color molding according to the embodiment.

FIGS. 25 and 26 are cross-sectional views showing a schematic configuration of the second mold M2 configured to mold the substrate 9 and the valve driven section 170 through two color molding. The fixed mold M21 of the second mold M2 has a protrusion 170aM having a shape and a protrusion amount corresponding to a shape and a depth of the opening section 170a of the valve driven section 170. The movable mold M22 is formed in the same shape as that of the movable mold M12.

Next, a procedure of molding the substrate 9 and the valve driven section (for example, the second molding section) 170 using the first mold M1 and the second mold M2 will be described.

First, as shown in FIG. 23, in the first mold clamped state, for example, the cavity 9M is filled with the molten resin formed of a hard material to mold the substrate 9 in the first mold M1 in the primary side shot end IJ1. Further, in the first molding, since there is no molded article in the second mold M2, injection of the molten resin from the secondary side shot end IJ2 is not performed. The substrate 9 is molded by cooling the molten resin filled in the first mold M1. Then, for example, after the substrate 9 is molded by the first mold M1, the first mold M1 and the second mold M2 are opened. In the first mold M1, as the fixed mold M11 is separated from the movable mold M12, as shown in FIG. 24, the opening section 52 of the substrate 9 held in the movable mold M12 is exposed. After that, a position (for example, a first position) of the movable mold M12 in the first mold M1 and a position (for example, a second position) of the movable mold M22 in the first mold M2 are inverted by the inverting machine RV (not shown in FIGS. 22 to 26).

FIG. 25 shows the second mold M2 in a state in which the molds are clamped after the position of the movable mold M12 and the position of the movable mold M22 are inverted (a second mold clamped state). As shown in FIG. 25, the substrate 9 molded by the first mold M1 is installed in the second mold M2. In the second mold M2, a cavity (an internal space) 170M having the same shape as that of the valve driven section 170 is formed by the substrate 9 molded by the first mold M1, the protrusion 170aM of the fixed mold M21, and a surface 40AM of the movable mold M22. For example, the molded substrate 9 is a part of the components that form the cavity (the internal space) 170M.

Figure 27:
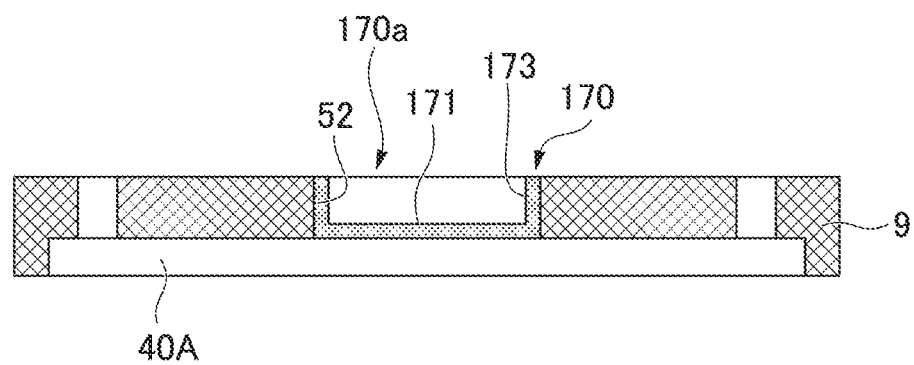
FIG. 27 is a cross-sectional view of a substrate and a valve driven section that constitute the fluidic device according to the embodiment.

Next, in the second mold M2, as shown in FIG. 26, the cavity 170M is filled with the molten resin formed of a soft material from the secondary side shot end IJ2. After that, the valve driven section 170 thermally fused and integrated with the substrate 9 is molded in the second mold M2 by cooling the molten resin. For example, in the second mold M2, the valve part 171 and the cylindrical section 173 are simultaneously molded. Further, molding of the above-mentioned the substrate 9 is performed in the first mold M1 integrally and simultaneously with molding of the valve driven section 170 in the second mold M2. After that, as shown in FIG. 27, the substrate 9 and the valve driven section 170 that are formed using different materials and that are integrated (fixed to each other) are obtained by opening the first mold M1 and the second mold M2 and releasing the molded article in the second mold M2.

Figure 28:
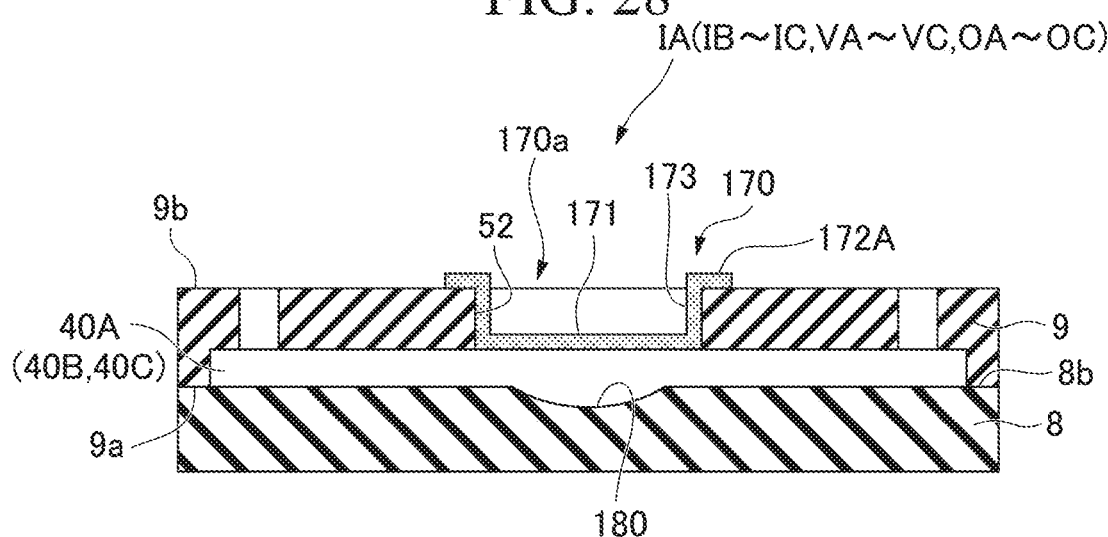
FIG. 28 is a cross-sectional view showing a variant of a valve part according to the embodiment.

Further, while the valve driven section 170 including the valve part 171 and the cylindrical section 173 is exemplified as the valve of the third embodiment, like the valve driven section 70 shown in FIG. 14, the valve driven section 170 may have a configuration further including a seal section 172A. For example, as shown in FIG. 28, the valve driven section 170 may have a configuration including the seal section 172A connected to an upper end of the cylindrical section 173, formed to cover the opening section 52 integrally and simultaneously as a single member together with the valve part 171, and extending (overhanging) over the upper surface 9b of the substrate 9 in a direction (for example, a radial direction) away from the opening section 52.

Fourth Embodiment of Valve

Figure 29:
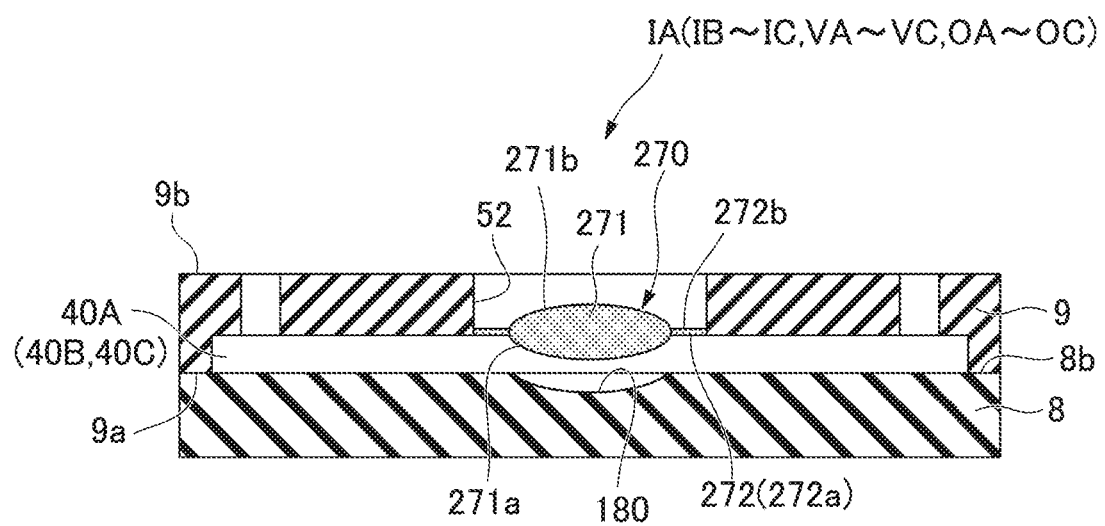
FIG. 29 is a cross-sectional view showing a configuration of the introduction valve according to the embodiment.
Figure 30:
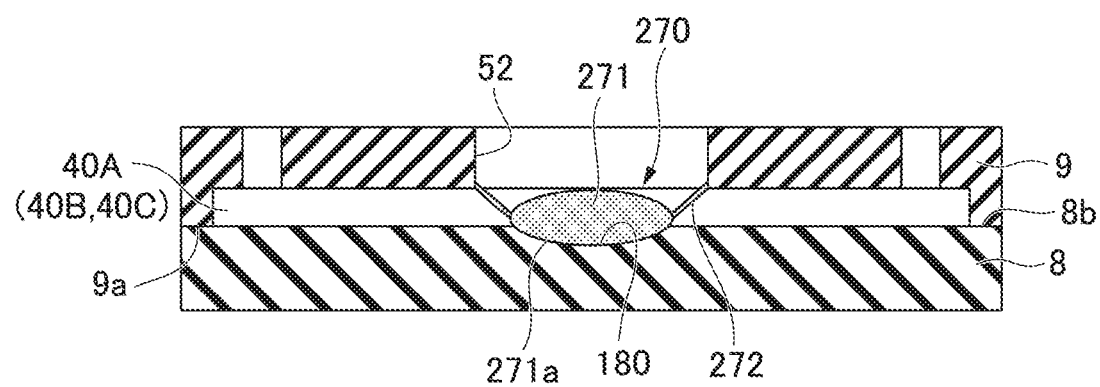
FIG. 30 is a cross-sectional view showing a configuration of the introduction valve according to the embodiment.

FIG. 29 is a cross-sectional view showing a configuration of an introduction valve IA as a fourth embodiment of the valve. Further, a configuration of each of the above-mentioned other valves (for example, the introduction valves IB and IC, the fixed quantity valves VA, VB and VC and the waste liquid valves OA, OB and OC) may be the same as that of the introduction valve IA of the embodiment. In FIG. 29, the same components as those of the third embodiment of the valve shown in FIG. 20 are designated by the same reference characters, and description thereof will be omitted. As shown in FIG. 29, a valve driven section 270 is formed in the opening section 52 of the substrate 9. The valve driven section 270 is formed of the same soft material as that of the valve part 50, and includes a valve part (a deformation section) 271 and a support section 272. The support section 272 has a lower surface 272a and an upper surface 272b and formed in a thin film shape. The lower surface 272a of the support section 272 is formed to be substantially flush with a bottom section of the flow path (for example, the cavity 40A). The support section 272 supports an outer circumference of the valve part 271, and connects the valve part 271 to a lower end of an inner circumferential surface of the opening section 52. The opening section 52 is closed on the side of the lower end by the valve part 271 and the support section 272. For example, the valve part 271 has a lower surface 271a and an upper surface 271b and is formed in an elliptical shape when seen in a cross-sectional view. As shown in FIG. 30, the lower surface 271a of the valve part 271 is fitted into the concave surface 180 of the lower plate 8 when the valve part 271 is moved downward when the support section 272 is deformed.

For example, the valve driven section 270 having the above-mentioned configuration controls an opening/closing state of the flow path (for example, the cavity 40A) according to deformation of the support section 272 when a downward force (for example, a pneumatic pressure, a liquid pressure, a mechanical force, or the like) is added to the valve part 271 via the opening section 52. As an example, as shown in FIG. 30, the flow path (for example, the cavity 40A) is closed (a state in which the valve is closed) as the valve part 271 moves toward the cavity 40A and the lower surface 271a comes in contact with the concave surface 180. In addition, in the valve driven section 270, displacement of the support section 272 is solved by releasing the application of the downward force to the valve part 271 and the flow path (for example, the cavity 40A) is opened as the lower surface 271a is separated from the concave surface 180 (a state in which the valve is open).

Next, a method (a molding method) of integrating the substrate 9 and the valve driven section 270 using the first mold M1 and the second mold M2 through two color molding will be described with reference to FIGS. 31 to 36. In FIGS. 31 to 36, the same components as those when the substrate 9 and the valve driven section 170 shown in FIGS. 22 to 27 are formed through two color molding are designated by the same reference characters, and description thereof will be omitted. In addition, while a mold opening/closing direction in the mold used when the substrate 9 and the valve driven section 270 are molded may be a horizontal direction or a vertical direction, as an example, the embodiment will be described using the mold opening/closing direction as the vertical direction. In addition, here, a place in the substrate 9 at which the valve driven section 270 is formed is shown and described.

Figure 31:
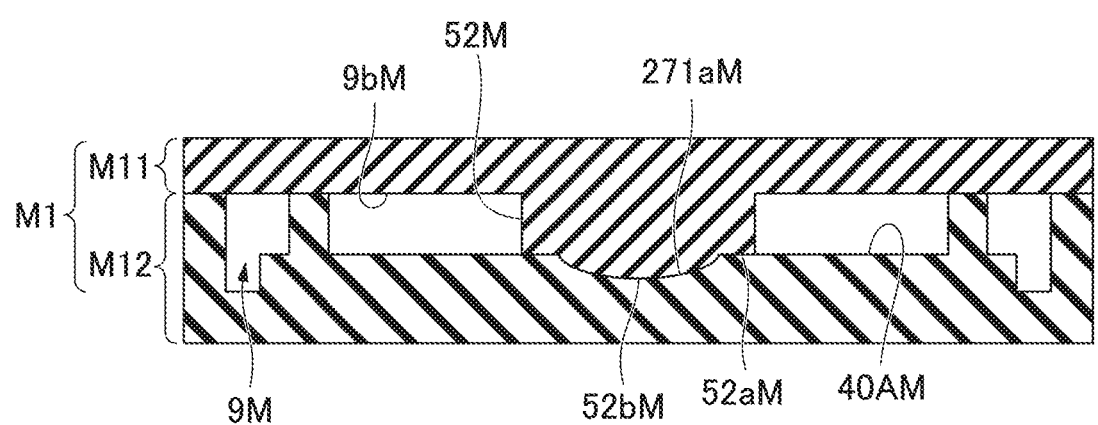
FIG. 31 is a cross-sectional view showing a schematic configuration of the first mold according to the embodiment.
Figure 32:
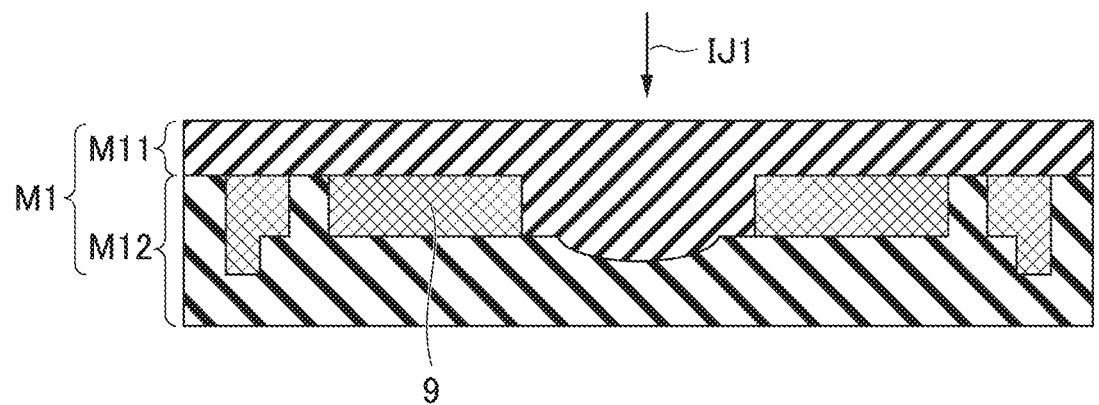
FIG. 32 is a view showing a procedure of two color molding according to the embodiment.
Figure 33:
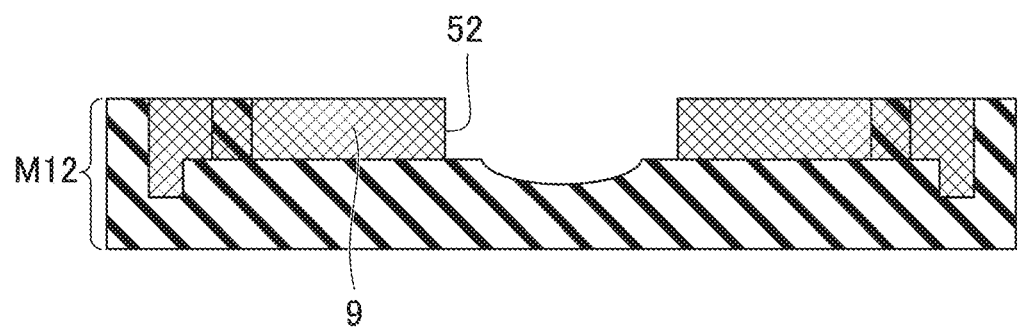
FIG. 33 is a view showing a procedure of two color molding according to the embodiment.

FIGS. 31 to 33 are cross-sectional views showing a schematic configuration of the first mold M1 for forming the substrate 9 and the valve driven section 270 through two color molding. The fixed mold M11 of the first mold M1 has the surface 9bM that forms the upper surface 9b of the substrate 9 and the protrusion 52M that forms the opening section 52 of the substrate 9. A flat surface 52aM and a curved surface 52bM are formed on a tip (a lower end) of the protrusion 52M. A protrusion amount of the flat surface 52aM is set to a value corresponding to a distance from a bottom section of the cavity 40A to the upper surface 9b in the substrate 9. A shape and a position of the curved surface 52bM are set to a shape and a position corresponding to the lower surface 271a of the valve part 271.

The movable mold M12 has the protrusion 40AM that forms the cavity 40A, and the cavity (the internal space) 9M that molds most part of the substrate 9 except the upper surface 9b and the opening section 52. A concave surface 271aM having a shape and a position corresponding to those of the lower surface 271a of the valve part 271 is formed on the protrusion 40AM.

Figure 34:
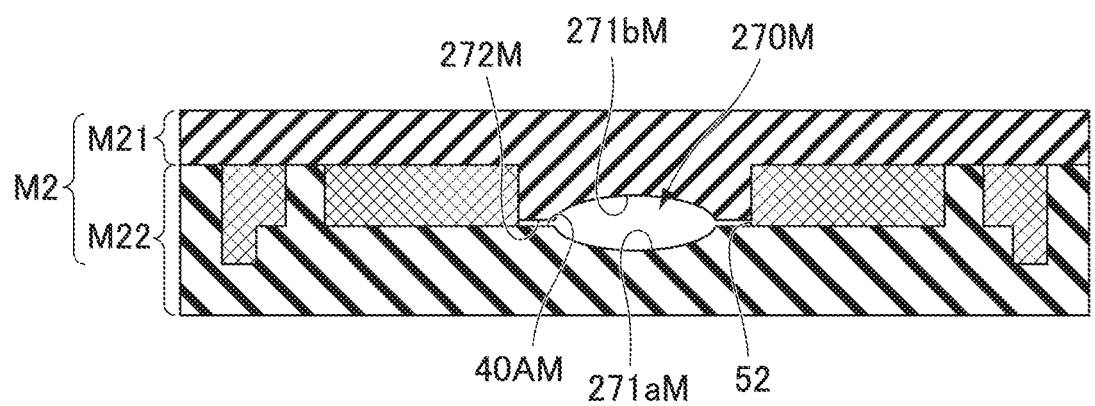
FIG. 34 is a cross-sectional view showing a schematic configuration of the second mold according to the embodiment.
Figure 35:
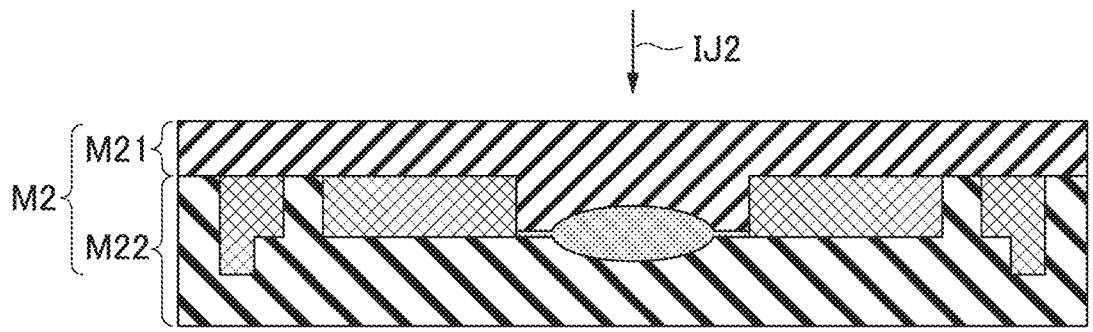
FIG. 35 is a view showing a procedure of two color molding according to the embodiment.

FIGS. 34 and 35 are cross-sectional views showing a schematic configuration of the second mold M2 for forming the substrate 9 and the valve driven section 270 through two color molding. The fixed mold M21 of the second mold M2 has a protrusion 272M inserted into the opening section 52 of the substrate 9 upon closing of the mold and forming the upper surface 272b of the support section 272. A concave surface 271bM that forms the upper surface 271b of the valve part 271 is formed in a tip surface (a lower surface) of the protrusion 272M. The movable mold M22 is formed in the same shape as that of the above-mentioned movable mold M12.

Next, a procedure of molding the substrate 9 and the valve driven section (for example, the second molding section) 170 using the first mold M1 and the second mold M2 will be described.

First, as shown in FIG. 32, in the first mold clamped state, the cavity 9M is filled with the molten resin formed of a hard material for molding the substrate 9 in the first mold M1 from the primary side shot end IJ1. In the first molding, since there is no molded article in the second mold M2, injection of the molten resin is not performed from the secondary side shot end IJ2. The substrate 9 is molded by cooling the molten resin filled into the first mold M1. When the substrate 9 is molded by the first mold M1, the first mold M1 and the second mold M2 are opened. In the first mold M1, when the fixed mold M11 is separated from the movable mold M12, as shown in FIG. 33, the opening section 52 of the substrate 9 held by the movable mold M12 is exposed. After that, a position (for example, a first position) of the movable mold M12 in the first mold M1 and a position (for example, a second position) of the movable mold M22 in the first mold M2 are inverted by the inverting machine RV (not shown in FIGS. 31 to 35).

FIG. 34 shows the second mold M2 in a state (a second mold clamped state) in which the molds are clamped after the position of the movable mold M12 and the position of the movable mold M22 are inverted. As shown in FIG. 34, the substrate 9 molded in the first mold M1 is installed in the second mold M2. In the second mold M2, a cavity (an internal space) 270M having the same shape as that of the valve driven section 270 is formed by the opening section 52 of the substrate 9 molded in the first mold M1, the protrusion 272M and the concave surface 271bM of the fixed mold M21, and the surface 40AM and the concave surface 271aM of the movable mold M22. For example, the molded substrate 9 is a part of the components that form the cavity (the internal space) 270M.

Figure 36:
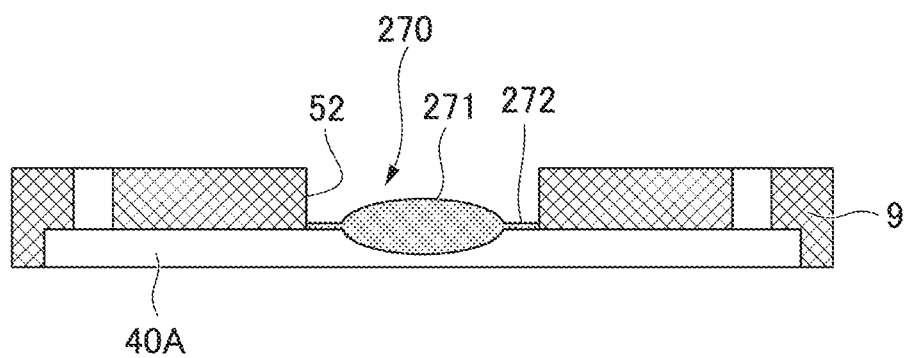
FIG. 36 is a cross-sectional view of a substrate and a valve driven section that constitute the fluidic device according to the embodiment.

Next, in the second mold M2, as shown in FIG. 35, the cavity 270M is filled with the molten resin formed of a soft material from the secondary side shot end IJ2. After that, the valve driven section 270 thermally fused and integrated with the substrate 9 is molded in the second mold M2 by cooling the molten resin. For example, the valve part 271 and the support section 272 are integrally and simultaneously molded in the second mold M2. Further, molding of the above-mentioned substrate 9 is performed in the first mold M1 simultaneously with molding of the valve driven section 270 in the second mold M2. After that, as shown in FIG. 36, the substrate 9 and the valve driven section 270 that are formed using different materials and that are molded and integrated (fixed to each other) are obtained by opening the first mold M1 and the second mold M2 and releasing the molded article in the second mold M2.

Since the valve driven section 270 of the embodiment has a large mass and, as shown in FIG. 30, an inertial force becomes large when the flow path (for example, the cavity 40A) is closed (a state in which the valve is closed) due to the lower surface 271a of the valve part 271 comes in contact with the concave surface 180, it is possible to suppress the release of the closing of the flow path according to a pressure of a fluid flowing through the flow path.

Figure 37:
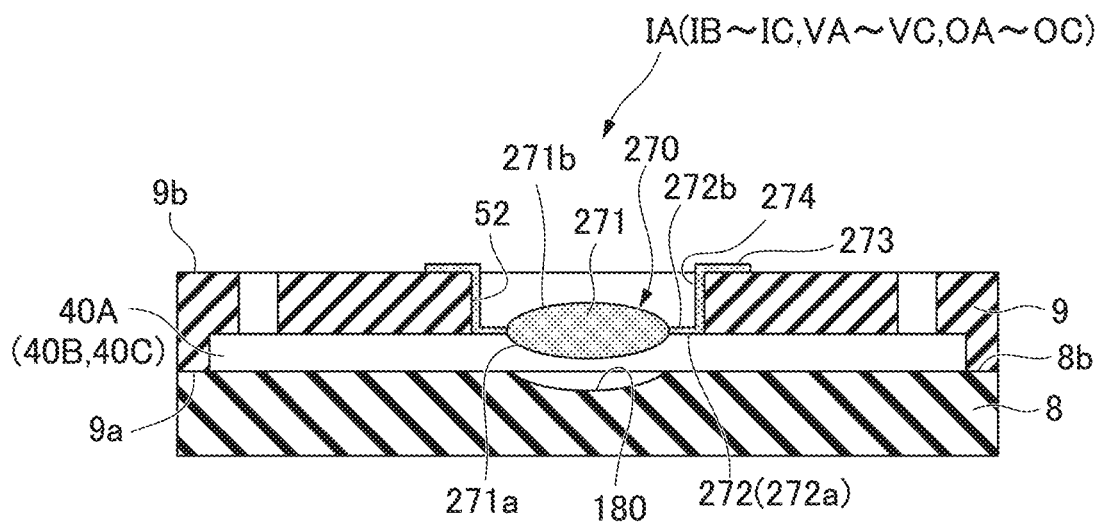
FIG. 37 is a cross-sectional view showing a variant of the valve part according to the embodiment.

Further, while the valve driven section 270 including the valve part 271 and the support section 272 has been exemplified as the valve of the fourth embodiment, like the valve driven section 70 shown in FIG. 14, the valve driven section 270 may have a configuration including a seal section 273. For example, as shown in FIG. 37, the valve driven section 270 may have a configuration including the seal section 273 having a cylindrical section 274 connected to the support section 272 at a lower end and formed along an inner circumferential surface of the opening section 52, connected to an upper end of the cylindrical section 274, formed to cover the opening section 52 integrally and simultaneously as a single member together with the valve part 171, and extending (overhanging) over the upper surface 9b of the substrate 9 in a direction (for example, radial direction) away from the opening section 52.

Hereinabove, while the preferred embodiments according to the present invention have been described with reference to the accompanying drawings, of course the present invention is not limited to the related examples. All of shapes, combinations, or the like, of the components shown in the above-mentioned examples are merely exemplary and various modifications and combinations based on design requirements or the like may be made without departing from the scope of the present invention.

For example, while the valve driving section 15 according to the embodiment has been exemplified by a configuration of opening and closing a valve by deforming the valve parts 50 and 70 using a pneumatic pressure, the embodiment is not limited to the configuration and a configuration of deforming the valve part 50 and the valve driven section 70 using a mechanical driving device such as a motor (for example, an actuator) may be provided.

Figure 38:
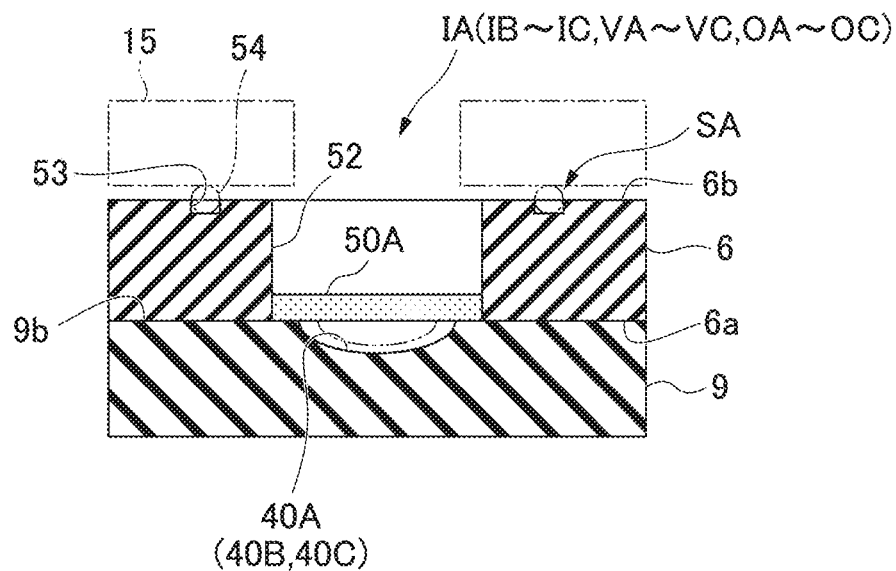
FIG. 38 is a cross-sectional view showing a variant of the valve part according to the embodiment.
Figure 39:
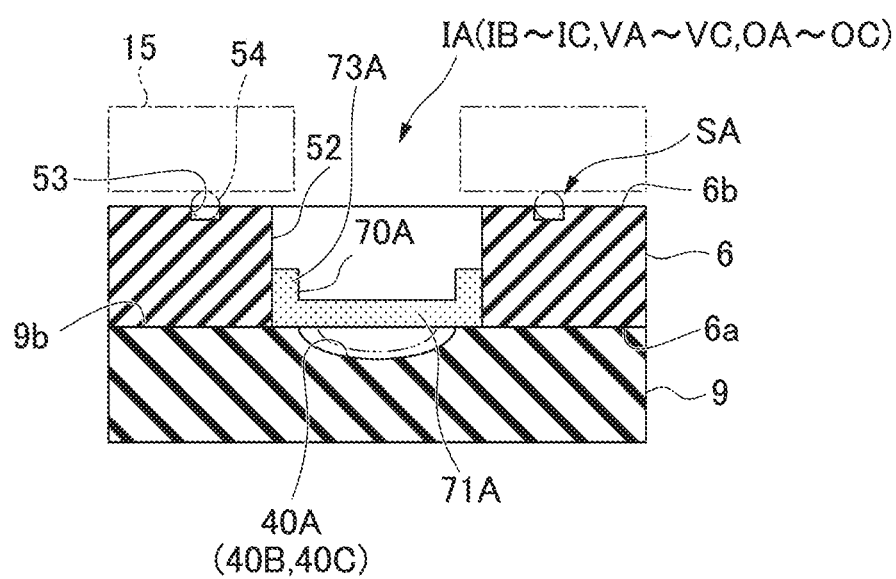
FIG. 39 is a cross-sectional view showing a variant of the valve part according to the embodiment.

In addition, while the valve part 50 configured to be accommodated in the cavity 51 formed in the upper plate 6 has been exemplified in the embodiment, for example, as shown in FIG. 38, a configuration using the valve part 50A in which an outer circumferential surface is held by the opening section 52 of the upper plate 6 may be provided. When the valve part 50A is used, in addition to acquisition of the same action and effect when the valve part 50 is used, a volume of the valve part 50A can be reduced and a use amount of the material can be reduced while omitting labors taken to form the cavity 51 in the upper plate 6. In addition, as shown in FIG. 39, a configuration using the valve driven section 70A having the valve part 71A configured to close a lower end portion of the opening section 52 and the cylindrical section 73A extending upward from a circumferential edge of the closing section and having an outer circumferential surface held by the opening section 52 may be employed. The valve part 71A is formed to be thinner than the cylindrical section 73A. When the valve driven section 70A is used, the valve driven section 70A can be integrated with the upper plate 6 more strongly in comparison with the case in which the valve part 50A is used.

In addition, while the procedure of molding the upper plate in the first mold M1 and molding the valve parts 50 and 70 in the second mold M2 has been exemplified in the embodiment, a procedure of molding the valve parts 50 and 70 in the first mold M1 and molding the upper plate in the second mold M2 may be provided. In addition, for example, the first mold M1 and the second mold M2 according to the embodiment are molds of the fluidic device using two color molding, and are molds including the first mold M1 configured to mold the first molding section (for example, the valve part 50, the valve driven section 70 and the upper plate 6) of the fluidic device 100A and the second mold M2 configured to mold the second molding section (for example, the valve part 50, the valve driven section 70 and the upper plate 6) of the fluidic device 100A, which is different from the first molding section and integrally formed with at least a portion of the first molding section.

In addition, while the configuration in which the resin materials formed of two kinds of materials (a hard material and a soft material) are used as different materials has been exemplified in the embodiment, for example, a molded article integrally formed of the same material with a plurality of colors (for example, the same material with different two colors) may be molded.

In addition, while the configuration in which the upper plate 6 and the valve part 50 (or the valve driven section 70) are formed through two color molding has been exemplified in the embodiment, the substrate 9 and the valve part 50 (or the valve driven section 70) may be formed through two color molding such that the valve part 50 (or the valve driven section 70) is formed at a position facing the circulation flow path 10, the introduction flow paths 12A, 12B and 12C, the discharge flow paths 13A, 13B and 13C, and so on.

In addition, while the configuration in which the inlets 29A, 29B and 29C and the penetration sections 39A, 39B and 39C are formed in the substrate 9 has been described in the embodiment, they may be formed in the upper plate 6. When this configuration is employed, the penetration sections 39A, 39B and 39C may be disposed at positions facing the introduction flow paths 12A, 12B and 12C in the lower surface 6a of the upper plate 6, and the inlets 29A, 29B and 29C respectively connected to the penetration sections 39A, 39B and 39C may be formed to open to the upper surface 6b of the upper plate 6. When the inlets 29A, 29B and 29C are opened to the upper surface 6b of the upper plate 6, the solutions can be distributed to a place where mixing/reaction of the solutions LA, LB and LC is performed (for example, an inspection institute, a hospital, a house, a vehicle, or the like) in a state in which the upper surface 6b side of the upper plate 6 is sealed to hermetically seal the opening sections of the inlets 29A, 29B and 29C.

In addition, while the configuration in which the movable mold M12 and the movable mold M22 are moved relative to the fixed mold M11 and the fixed mold M22 by inverting a first position at which molding is performed using the primary side shot end IJ1 and the first mold M1 and a second position at which molding is performed using the secondary side shot end IJ2 and the second mold M2 for each molding processing has been exemplified in the embodiment, in addition to the configuration, a configuration in which the fixed mold M11 and the fixed mold M22 are moved relative to the movable mold M12 and the movable mold M22 by inverting the first position and the second position for each molding processing may be provided.

What is claimed is:
1. A fluidic device comprising:
 a flow path-side base member that includes a flow path on an upper surface thereof;
 a valve driven section comprising a valve that is configured to be deformed by a fluid to open and close the flow path;
 wherein the valve comprises:
  a support section, comprising a thin film formed as an upper part of the flow path, that is in contact with the upper surface, and
  a valve part, connected to the support section, which is capable to open the flow path through non-application of pressure by a valve driving section, and to close the flow path by contacting a lower part of the flow path facing the upper part of the flow path through application of pressure by the valve driving section,
 a seal section that is integrally formed with the valve driven section and that seals the fluid by coming in contact with a member that supplies the fluid; and
 a base member at which the valve part and the seal section are disposed and which is bonded to the upper surface, wherein the base member includes a first opening section that penetrates therethrough at a position facing the flow path, and wherein the valve driven section further comprises:

a cylindrical section that is connected with the support section and that is formed along an inner circumferential surface of the first opening section, an extension section that is connected with the cylindrical section and that covers a part of a surface of the base member which is in contact with an end portion of the first opening section, and a second opening section that includes surfaces of the support section, the cylindrical section, and the extension section, the seal section includes the extension section, a thickness of the valve part is less than a shortest length of the cylindrical section in a radial direction.

2. The fluidic device according to claim 1, wherein the base member comprises a first surface which is bonded with the flow path-side base member and a second surface located at an opposite side of the first surface, and the valve part is disposed in the first opening section on a side of the first surface and the seal section is disposed to protrude from the first opening section on a side of the second surface.

3. The fluidic device according to claim 2, wherein the seal section has a portion that protrudes toward the second surface and that contacts the second surface.

4. The fluidic device according to claim 3, further comprising an energy director section which is formed so as to protrude from a position surrounding the flow path at a bonding surface of one of the flow path-side base member and the base member, so as to bond the flow path-side base member and the base member.

5. The fluidic device according to claim 2, wherein the seal section extends in the second surface in a direction separating away from the first opening section.

6. The fluidic device according to claim 2, wherein the seal section is formed in a flange shape surrounding the first opening section.

7. The fluidic device according to claim 1, wherein the valve part and the seal section are integrally formed with a single member.

8. The fluidic device according to claim 1, wherein the valve part has an elliptical shape when seen in a cross-sectional view.

9. The fluidic device according to claim 8, wherein the valve part is moved downward when the support section is deformed through application of pressure by the valve driving section.

10. The fluidic device according to claim 8, wherein the flow path includes a concave surface with which the valve part comes into contact through application of pressure by the valve driving section.

* * * * *